US008933144B2

(12) United States Patent
Enomoto et al.

(10) Patent No.: US 8,933,144 B2
(45) Date of Patent: Jan. 13, 2015

(54) CURABLE COMPOSITION FOR IMPRINT, PATTERN-FORMING METHOD AND PATTERN

(71) Applicant: FUJIFILM Corporation, Minato-ku, Tokyo (JP)

(72) Inventors: Yuichiro Enomoto, Haibara-gun (JP); Kunihiko Kodama, Haibara-gun (JP); Shinji Tarutani, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/212,807

(22) Filed: Mar. 14, 2014

(65) Prior Publication Data

US 2014/0255662 A1    Sep. 11, 2014

Related U.S. Application Data

(63) Continuation of application No. PCT/JP2012/072686, filed on Sep. 6, 2012.

(30) Foreign Application Priority Data

Sep. 27, 2011  (JP) ................. 2011-210530

(51) Int. Cl.
| | | |
|---|---|---|
| *B29C 71/04* | (2006.01) | |
| *C09D 11/38* | (2014.01) | |
| *C08F 2/50* | (2006.01) | |
| *C08L 33/00* | (2006.01) | |
| *C09D 11/30* | (2014.01) | |
| *B41J 11/00* | (2006.01) | |
| *C09D 183/06* | (2006.01) | |
| *C09D 11/101* | (2014.01) | |
| *C08F 2/44* | (2006.01) | |
| *G03F 7/004* | (2006.01) | |
| *G03F 7/027* | (2006.01) | |

(52) U.S. Cl.
CPC . *C09D 11/38* (2013.01); *C08F 2/50* (2013.01); *C08L 33/00* (2013.01); *C09D 11/30* (2013.01); *B41J 11/002* (2013.01); *C09D 183/06* (2013.01); *C09D 11/101* (2013.01); *C08F 2/44* (2013.01); *G03F 7/0046* (2013.01); *G03F 7/0048* (2013.01); *G03F 7/027* (2013.01); *B41J 11/0015* (2013.01)
USPC ............. 522/67; 522/77; 522/79; 522/188; 522/8; 522/9; 428/195.1; 347/102

(58) Field of Classification Search
CPC .... C09D 183/06; C09D 11/101; C09D 11/30; C08L 33/00; C08F 2/50; B41J 11/002
USPC ............. 522/67, 77, 79, 188, 8, 9; 428/195.1; 347/102
See application file for complete search history.

(56) References Cited

U.S. PATENT DOCUMENTS

| | | |
|---|---|---|
| 5,169,965 A | 12/1992 | Fujiwa et al. |
| 5,198,509 A | 3/1993 | Fujiwa et al. |
| 5,259,926 A | 11/1993 | Kuwabara et al. |
| 5,338,879 A | 8/1994 | Fujiwa et al. |
| 5,378,736 A | 1/1995 | Fujiwa et al. |
| 5,772,905 A | 6/1998 | Chou |
| 5,956,216 A | 9/1999 | Chou |
| 7,198,968 B2 | 4/2007 | Chae et al. |
| 7,821,586 B2 | 10/2010 | Kim |
| 2005/0142714 A1 | 6/2005 | Chae et al. |
| 2005/0231669 A1 | 10/2005 | Kim |
| 2008/0305261 A1* | 12/2008 | Deroover et al. ............. 427/256 |
| 2011/0059302 A1 | 3/2011 | Kodama |

FOREIGN PATENT DOCUMENTS

| | | | |
|---|---|---|---|
| JP | 11-100378 A | 4/1999 | |
| JP | 2926262 B2 | 7/1999 | |
| JP | 2004-240241 A | 8/2004 | |
| JP | 2005-197699 A | 7/2005 | |
| JP | 2005-301289 A | 10/2005 | |
| JP | 2008-19292 A | 1/2008 | |
| JP | 2008-105414 A | 5/2008 | |
| JP | 2009-73078 A | 4/2009 | |
| JP | 2010-239121 A | 10/2010 | |

OTHER PUBLICATIONS

English translation of International Preliminary Report on Patentability mailed Apr. 10, 2014 for International Application No. PCT/JP2012/072686.
International Preliminary Report on Patentability mailed Apr. 10, 2014 for International Application No. PCT/JP2012/072686.
Stephen Y. Chou, et al., "Imprint of sub25 nm vias and trenches in polymers", Applied Physics Letters, 1995, pp. 3114-3116, vol. 67.
M. Colburn, et al., "Step and Flash Imprint Lithography: A New Approach to High-Resolution Patterning", SPIE vol. 3676, Mar. 1999, pp. 379-389.
Stephen C. Lapin, "Vinyl Ether Functionalized Urethane Oligomers: An Alternative to Acrylate Based Systems", Polymers Paint Colour Journal, May 17, 1989, pp. 320-328, vol. 179, No. 4237.
"Jikken Kagaku Koza (The Course of Experimental Chemistry)", 20, Yukigosei (Organic Synthesis) II, $4^{th}$ Edition, pp. 212-225, Maruzen Co., Ltd., 1992.
Yoshimura, Secchaku, 1985, pp. 32-39, vol. 29, No. 12.
Yoshimura, Secchaku, 1986, pp. 42-47, vol. 30, No. 5.
Yoshimura, Secchaku, 1986, pp. 42-47, vol. 30, No. 7.
Alfred Hassner, editor, "The Chemistry of Heterocyclic Compounds—Small Ring Heterocycles, Part 3 Oxiranes", John Wiley & Sons, An Interscience Publication, New York, 1985, pp. 1-199, vol. 42.
International Search Report of PCT/JP2012/072686, dated Dec. 4, 2012.
International Written Opinion of PCT/JP2012/072686, dated Dec. 4, 2012.

* cited by examiner

*Primary Examiner* — Betelhem Shewareged
(74) *Attorney, Agent, or Firm* — Sughrue Mion, PLLC

(57) ABSTRACT

Provide a curable composition for imprint, which is improved in the surface roughness of the cured film. A curable composition for imprint comprising a polymerizable compound (A), a polymerization initiator (B), and a non-polymerizable compound (C),
the non-polymerizable compound (C) comprising at least one species of surfactant (C1) which contains 20% by mass or more of fluorine atom, and, at least one species of polymer (C2) which contains 3% by mass or more and less than 20% by mass of fluorine atom and/or 5% by mass or more and less than 40% by mass of silicon atom, and has a weight-average molecular weight (Mw) of 1,000 to 100,000.

20 Claims, 1 Drawing Sheet

(a)
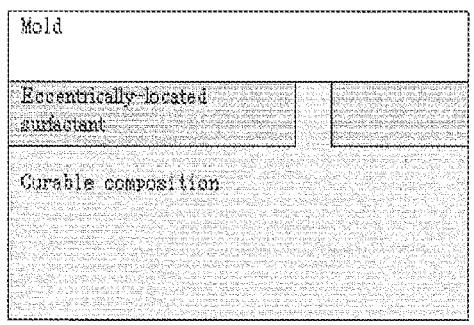
(b)
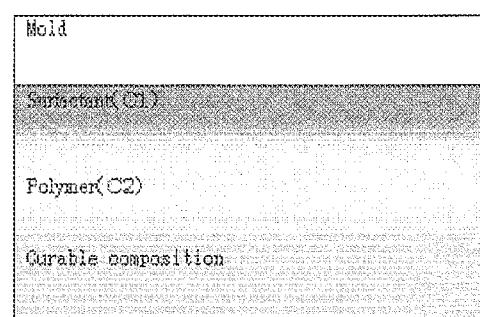

CURABLE COMPOSITION FOR IMPRINT, PATTERN-FORMING METHOD AND PATTERN

The present application is a continuation of PCT/JP2012/072686 filed on Sep. 6, 2012 and claims priority under 35 U.S.C. §119 of Japanese Patent Application No. 210530/2011 filed on Sep. 27, 2011.

The present invention relates to a curable composition for imprints. In further details, the present invention relates to a curable composition for imprints directed to fine patterning assisted by photo-irradiation, used for manufacturing various electronic devices, in particular, semiconductor integrated circuit, flat screen, micro electro-mechanical system (MEMS), sensor device, optical disk, magnetic recording media including high-density memory disk, optical components including grating and relief hologram, nanodevice, optical device, optical film and polarizing element used for manufacturing flat panel display, thin film transistor used for liquid crystal display, organic transistor, color filter, overcoat layer, pillar component, rib member for aligning liquid crystal, micro-lens array, immunoassay chip, DNA separation chip, micro-reactor, biological nanodevice, optical waveguide, optical filter, and photonic liquid crystal.

BACKGROUND ART

Nanoimprint technology is a development advanced from embossing technology well known in the art of optical disc production, which comprises pressing a mold original with an embossed pattern formed on its surface (this is generally referred to as "mold", "stamper" or "template") against a resin to thereby accurately transfer the micropattern onto the resin through mechanical deformation of the resin. In this, when a mold is once prepared, then microstructures such as nanostructures can be repeatedly molded, and therefore, this is economical, and in addition, harmful wastes and discharges from this nanotechnology are reduced. Accordingly these days, this is expected to be applicable to various technical fields.

Two methods of nanoimprint technology have been proposed; one is a thermal nanoimprint method using a thermoplastic resin as the material to be worked (for example, non-patent literature 1), and the other is a photonanoimprint method using a photocurable composition (for example, non-patent literature 2). In the thermal nanoimprint method, a mold is pressed against a polymer resin heated up to a temperature not lower than the glass transition temperature thereof, then the resin is cooled and thereafter released from the mold to thereby transfer the microstructure of the mold onto the resin on a substrate. The method has been expected to be applied in various fields, by virtue of its applicability to a wide variety of resin materials and glass materials. For example, Patent Literatures 1 and 2 discloses nanoimprinting processes capable of forming nanopatterns using thermoplastic resins at low costs.

On the other hand, according to photo-nanoimprinting process by which a nano-photocurable composition for imprints is illuminated by light through a translucent mold or a translucent substrate, so as to cure a nano-photocurable composition for imprints, it is no longer necessary to heat the material onto which a pattern is transferred when stamped under a mold, and this enables imprint at room temperature. In recent years, reports have been also issued regarding new trends of development including nanocasting process which combines advantages of the both, and reversal imprinting process capable of forming a three-dimensional stacked structure.

Applications listed below have been proposed for the imprinting.

A first application relates to that a geometry (pattern) per se obtained by molding is functionalized so as to be used as a nano-technology component, or a structural member. Examples of which include a variety of micro- or nano-optical component, high-density recording medium, optical film, and structural member of flat panel display.

A second application relates to building-up of a laminated structure by using a mold capable of simultaneously forming a micro-structure and a nano-structure, or by simple alignment between layers, and use of the laminated structure for manufacturing μ-TAS (Micro-Total Analysis System) or bio-chip.

A third application relates to use of the thus-formed pattern as a mask through which a substrate is worked typically by etching. By virtue of precise alignment and a large degree of integration, this technique can replace the conventional lithographic technique in manufacturing of high-density semiconductor integrated circuit, transistors in liquid crystal display device, and magnetic material for composing next-generation hard disk called patterned medium. Approaches for implementing the imprinting in these applications have been becoming more active in recent years.

As an exemplary application of the nanoimprinting process, first to be explained is an application to manufacture of high-density semiconductor integrated circuits. The semiconductor integrated circuits have been acceleratingly shrunk and integrated in these years, and for the purpose of implementing this sort of fine processing, photolithographic apparatuses used for pattern transfer have ceaselessly been improved in the preciseness. In order to address further requirements for shrinkage, it has however been becoming difficult to concurrently satisfy three requirements on resolution power of fine pattern, cost of apparatus, and throughput. In contrast, nanoimprint lithography (photo-nanoimprinting) has been proposed as a technique of forming fine patterns at low costs. For example, Patent Literature 1 and Patent Literature 3 listed below have disclosed nanoimprinting techniques using a silicon wafer as a stamper to form, by transfer, a fine structure of 25 nm or narrower. In this sort of application, a patternability as fine enough as several tens nanometers, and a high etching resistance enough to function as a mask during substrate working are required.

An exemplary application of the nanoimprint process to manufacture of the next-generation hard disk drive (HDD) will be explained. The HDD have achieved a large capacity by increasing the surface recording density. Increase in the recording density is, however, obstructed by so-called magnetic field spreading from the side faces of a magnetic head. Since the magnetic field spreading cannot be reduced beyond a certain value even if the head is shrunk, so that an event called side-writing may occur as a consequence. If the side-writing occurs, writing in the process of recording will extend to the adjacent track and will erase data already recorded therein. On the other hand, in the process of regeneration, an event such as reading of extra signal from the adjacent track may occur due to the spread magnetic field. In order to address these problems, there have been proposed techniques related to discrete track media and bit patterned media aimed at solving the problems by filling the inter-track gap with a non-magnetic material to thereby physically and magnetically isolate the tracks. Nanoimprinting has been also proposed to be applied to the formation of a magnetic or non-magnetic pattern in the manufacture of these media. Also in these applications, again a patternability as fine enough as several tens nanometers, and a high etching resistance enough to function as a mask during substrate working are required.

Next, applications of the nanoimprinting process to flat displays such as liquid crystal display (LCD) and plasma display (PDP) will be explained.

With recent trends in dimensional expansion and higher definition of LCD substrate and PDP substrate, photo-nanoimprinting has recently attracted public attention as an inexpensive lithographic technique substitutive to the conventional photolithography having been used for manufacturing thin film transistor (TFT) and electrode sheet. The situation has raised a need for development of a photo-curable resist substitutive for etching photoresists having been used for the conventional photolithographic process.

There is also an ongoing trend in application of photo-nanoimprinting process to manufacture of structural members of LCD and so forth, such as translucent protective films described in Patent Literature 4 and Patent Literature 5, and a spacer described in Patent Literature 5. The resist for configuring these structural members is occasionally referred to as "permanent resist" or "permanent film", since it finally remains in the display.

Spacers which determine the cell gap in the liquid crystal display are also a kind of the permanent film, for which photo-curable compositions composed of a resin, a photo-polymerizable monomer and an initiator have widely been used in the conventional photolithography (see Patent Literature 6, for example). The spacers are generally formed after a color filter or a color filter protecting film was formed over a color filter substrate, by coating a photo-curable composition, patterning it by photolithography into a pattern of 10 μm to 20 μm wide or around, and then curing it under heating by post-baking.

The nanoimprinting process may also be applied to formation of an anti-reflective structure generally called moth-eye. The anti-reflective structure having the refractive index varied in the thickness-wise direction thereof, may be formed by forming, on the surface of a translucent molding, an enormous number of fine irregularities composed of a translucent material with a pitch not larger than the wavelength of light. This sort of anti-reflective structure has the refractive index continuously varies in the thickness-wise direction thereof without producing boundaries of the refractive index, and may be given as theoretically non-reflective. The structure are superior in the anti-reflective performance over multi-layered, anti-reflective films, by virtue of its small wavelength dependence, and high anti-reflective performance against an obliquely incident light.

The nanoimprinting lithography is also useful for applications regarding formation of permanent films, which include micro electro-mechanical system (MEMS), sensor device, optical components including grating and relief hologram, nanodevice, optical device, optical film and polarizing element used for manufacturing flat panel display, thin film transistor used for liquid crystal display device, organic transistor, color filter, overcoat layer, pillar component, rib member for aligning liquid crystal, micro-lens array, immunoassay chip, DNA separation chip, micro-reactor, biological nanodevice, optical waveguide, optical filter, and photonic liquid crystal.

In these applications regarding the permanent films, the thus-formed permanent films finally remain in the products, and are therefore required to be excellent mainly regarding durability and strength of the film, including heat resistance, light resistance, solvent resistance, scratch resistance, high mechanical performance under externally applied pressure, and hardness.

As described above, most of the patterns having been formed by the conventional photolithographic process may be formed by nanoimprinting, which has attracted public attention for its possibility of forming fine patterns at low costs, as known by Patent Literatures 7, for example.

CITATION LIST

Patent Literature

[Patent Literature 1] U.S. Pat. No. 5,772,905
[Patent Literature 2] U.S. Pat. No. 5,956,216
[Patent Literature 3] U.S. Pat. No. 5,259,926
[Patent Literature 4] JP-A-2005-197699
[Patent Literature 5] JP-A-2005-301289
[Patent Literature 6] JP-A-2004-240241
[Patent Literature 7] JP-A-2008-19292

Non-Patent Literature

[Non-Patent Literature 1] S. Chou et al., *Appl. Phys. Lett.*, Vol. 67, 3114 (1995)
[Non-Patent Literature 2] M. Colbun et al., *Proc. SPIE, Vol.* 3676, 379 (1999)

SUMMARY OF THE INVENTION

Technical Problem

Under such circumstances, the present inventor investigated into Patent Literature 7 mentioned above, and found out a problem in the surface roughness of a cured film obtained after the curable composition for imprint is cured. It is therefore an object of the present invention to solve the conventional problems described above, and is to improve the surface roughness of the cured film obtained after curing the curable composition for imprint.

Solution to Problem

In the method of forming, on a substrate, a pattern composed of a photo-curable composition by imprinting, it is popular to add a surfactant to the curable composition. This is because, by adding the surfactant, the free energy at the interface between mold and pattern will decrease, and the mold releasing performance will be improved. The present inventor found out from its investigation that the rate of coverage of the mold interface with the surfactant is not 100% in general, as schematically illustrated in FIG. 1(a), or rather, that some areas are found to be partially less releasable. Such partially less releasable areas are taken away with the mold in the process of mold releasing, to thereby produce an irregularity on the surface of a cured film. There are two possible methods of reducing this influence. The first method is to increase the content of fluorine atom, aiming at enhancing the degree of eccentric location of the surfactant. The second method is to increase the amount of addition of fluorine atom. If, however, the degree of eccentric location is too high or the amount of addition is too much, the surfactant would cause micro phase separation at the interface, to further emphasize the irregularity. The trade-off relation need be resolved, in order to smoothen the surface of the cured film.

Under such circumstances, the present inventor conducted thorough investigations, and finally found that the subjects described above may be solved by using a polymer which satisfies a specific requirement and contains fluorine atom and/or silicon atom, in addition to the fluorine atom-containing surfactant.

While the reason why still remains unclear, as schematically illustrated in FIG. 1(b), a compound which contains a low content of fluorine atom or silicon atom (low-F-content activator) resides between a compound which has a high ratio of content of fluorine atom (high-F-content activator) and the curable compound, thereby phase separation is suppressed, and the irregularity is suppressed from generating.

The problem was solved by a means <1> described below, and more preferably by means <2> to <11>.

<1> A curable composition for imprint comprising a polymerizable compound (A), a polymerization initiator (B), and a non-polymerizable compound (C), the non-polymerizable compound (C) comprising at least one species of surfactant (C1) which contains 20% by mass or more of fluorine atom, and, at least one species of polymer (C2) which contains 3% by mass or more and less than 20% by mass of fluorine atom and/or 5% by mass or more and less than 40% by mass of silicon atom, and has a weight-average molecular weight (Mw) of 1,000 to 100,000.

<2> The curable composition for imprint of <1>, wherein the polymer (C2) contains, at least, 3% by mass or more and less than 20% by mass of fluorine atom.

<3> The curable composition for imprint of <1> or <2>,
wherein difference between the fluorine atom content (% by mass) of the compound (C1) and the total content (% by mass) of fluorine atom and silicon atom of the polymer (C2) is 3 to 70% by mass.

<4> The curable composition for imprint any one of <1> to <3>,
wherein the compound (C1) is a compound having a fluorine atom-containing alkyl group, a fluorine atom-containing cycloalkyl group, or a fluorine atom-containing aryl group.

<5> The curable composition for imprint any one of <1> to <4>,
wherein the polymer (C2) is a compound having a fluorine atom-containing alkyl group, a fluorine atom-containing cycloalkyl group, or fluorine atom-containing aryl group.

<6> The curable composition for imprint any one of <1> to <5>,
wherein the polymerizable compound (A) is a (meth)acrylate compound.

<7> The curable composition for imprint any one of <1> to <6>,
wherein the polymerizable compound (A) is a compound having an aromatic group and/or an alicyclic hydrocarbon group.

<8> A method of forming a pattern, the method comprising:
applying the curable composition for imprint described in any one of <1> to <7> on a substrate or on a mold having a fine pattern formed thereon, and subjecting the curable composition for imprint to light exposure, while being held between the mold and the substrate.

<9> The method of forming a pattern of <8>, wherein the curable composition for imprint is applied on the substrate by ink jet process.

<10> A pattern formed by the method described in <8> or <9>.

<11> The pattern of <10>,
wherein, when viewed in the thickness-wise direction of the pattern, the fluorine atom content in the 10% range from the substrate surface, the fluorine atom content in the 45 to 55% range from the substrate surface, and the fluorine atom content in the 90 to 100% range from the substrate surface, increase in this order.

<12> An electronic device comprising the pattern described in <10> or <11>.

<13> A method of manufacturing an electronic device comprising the method of forming a pattern described in <8> or <9>.

Advantageous Effects of Invention

According to the present invention, it became now possible to provide a curable composition for imprint, which is improved in the surface roughness of the cured film.

BRIEF DESCRIPTION OF DRAWINGS

FIG. 1 A schematic drawings illustrating relations between a mold and a pattern during light exposure, wherein (a) is a schematic drawing illustrating a conventional relation between a mold and a pattern, and (b) is a schematic drawing illustrating a relation between a mold and a pattern in the present invention.

DESCRIPTION OF EMBODIMENTS

The contents of the invention are described in detail hereinunder. In this description, the numerical range expressed by the wording "a number to another number" means the range that falls between the former number indicating the lowermost limit of the range and the latter number indicating the uppermost limit thereof.

In this description, "(meth)acrylate" means acrylate and methacrylate; "(meth)acrylic" means acrylic and methacrylic; "(meth)acryloyl" means acryloyl and methacryloyl. The monomer in the context of the present invention is discriminated from oligomer and polymer, and is defined as any compound having a weight average molecular weight of 1,000 or smaller. In this specification, "functional group" refers to a group which participates in a polymerization reaction.

"Imprint" referred to in the invention is meant to indicate pattern transfer in a size of from 1 nm to 10 mm and preferably meant to indicate pattern transfer in a size of from about 10 nm to 100 μm (nanoimprint).

Regarding the expression of "group (atomic group)" in this description, the expression with no indication of "substituted" or "unsubstituted" includes both "substituted group" and "unsubstituted group". For example, "alkyl group" includes not only an alkyl group not having a substituent (unsubstituted alkyl group) but also an alkyl group having a substituent (substituted alkyl group).

The curable composition for imprint of the present invention contains a (A) polymerizable compound, a (B) polymerization initiator, and a (C) non-polymerizable compound. As the non-polymerizable compound (C), (C1) at least one species of surfactant which contains 20% by mass or more of fluorine atom, and (C2) at least one species of polymer which contains 3% by mass or more and less than 20% by mass of fluorine atom and/or 5% by mass or more and less than 40% by mass of silicon atom, and has a weight-average molecular weight (Mw) of 1,000 to 100,000, are contained. By virtue of this configuration, a cured film obtained by curing the curable composition for imprint will now be less likely to produce irregularities on the surface thereof.

The curable composition for imprint in the present invention contains a (A) polymerizable compound and a (B) polymerization initiator. The (A) polymerizable compound is exemplified by monomer having a polymerizable group, an oligomer having a polymerizable group, polymer having a polymerizable group, and mixtures of them. For example, some commercially available polymerizable compounds might contain not only monomers having polymerizable groups, but also trace amounts of oligomer and polymer produced by polymerization of such monomer, which are understood to be also included in the polymerizable compound of the present invention.

Species of the polymerizable compound used for the curable composition for imprint of the present invention are not specifically limited without departing from the spirit of the present invention. Examples include polymerizable unsaturated monomers having one or more ethylenic unsaturated bond-containing group; epoxy compound, oxetane compound; vinyl ether compound; styrene derivative; fluorine atom-containing compound; and propenyl ether or butenyl ether.

The polymerizable unsaturated monomer having one or more ethylenic unsaturated bond-containing groups will be explained.

To begin with, the polymerizable unsaturated monomer having one or more ethylenic unsaturated bond-containing groups is specifically exemplified by methyl (meth)acrylate, ethyl (meth)acrylate, butyl (meth)acrylate, N-vinylpyrrolidinone, 2-acryloyloxyethyl phthalate, 2-acryloyloxy-2-hydroxyethyl phthalate, 2-acryloyloxy ethylhexahydro phthalate, 2-acryloyloxypropyl phthalate, 2-ethyl-2-butylpropanediol acrylate, 2-ethylhexyl (meth)acrylate, 2-ethylhexylcarbitol (meth)acrylate, 2-hydroxybutyl (meth)acrylate, 2-hydroxyethyl (meth)acrylate, 2-hydroxypropyl (meth)acrylate, 4-hydroxybutyl (meth)acrylate, acrylic acid dimer, benzyl (meth)acrylate, 1- or 2-naphthyl (meth)acrylate, butoxyethyl (meth)acrylate, cetyl (meth)acrylate, ethylene oxide-modified (referred to as "EO", hereinafter) cresol (meth)acrylate, dipropylene glycol (meth)acrylate, ethoxylated phenyl (meth)acrylate, isooctyl (meth)acrylate, cyclohexyl (meth)acrylate, isobornyl (meth)acrylate, dicyclopentanyl (meth)acrylate, dicyclopentanyloxyethyl (meth)acrylate, isomyristyl (meth)acrylate, lauryl (meth)acrylate, methoxydipropylene glycol (meth)acrylate, methoxytripropylene glycol (meth)acrylate, methoxypolyethylene glycol (meth)acrylate, methoxytriethylene glycol (meth)acrylate, neopentyl glycol benzoate (meth)acrylate, nonylphenoxypolyethylene glycol (meth)acrylate, nonylphenoxypolypropylene glycol (meth)acrylate, octyl (meth)acrylate, paracumylphenoxyethylene glycol (meth)acrylate, epichlorohydrin (referred to as "ECH", hereinafter)-modified phenoxy acrylate, phenoxyethyl (meth)acrylate, phenoxydiethylene glycol (meth)acrylate, phenoxyhexaethylene glycol (meth)acrylate, phenoxytetraethylene glycol (meth)acrylate, polyethylene glycol (meth)acrylate, polyethylene glycol-polypropylene glycol (meth)acrylate, polypropylene glycol (meth)acrylate, stearyl (meth)acrylate, EO-modified succinyl (meth)acrylate, tribromophenyl (meth)acrylate, EO-modified tribromophenyl (meth)acrylate, tridodecyl (meth)acrylate, p-isopropenyl phenol, N-vinylpyrrolidone, and N-vinylcaprolactam.

Among the monofunctional polymerizable compound having an ethylenic unsaturated bond, it is preferable in the present invention to use monofunctional (meth)acrylate compound, from the viewpoint of photo-curing. The monofunctional (meth)acrylate compound is exemplified by those previously exemplified as the monofunctional polymerizable compound having ethylenic unsaturated bond.

Among these sorts of monofunctional (meth)acrylates having aromatic structure and/or alicyclic hydrocarbon structure, preferable examples include benzyl (meth)acrylate, benzyl (meth)acrylate having a substituent on the aromatic ring (preferable substituent includes $C_{1-6}$ alkyl group, $C_{1-6}$ alkoxy group, cyano group), 1- or 2-naphthyl (meth)acrylate, 1- or 2-naphthylmethyl (meth)acrylate, 1- or 2-naphthylethyl (meth)acrylate, dicyclopentanyl (meth)acrylate, dicyclopentanyloxyethyl (meth)acrylate, isobornyl (meth)acrylate and adamantyl (meth)acrylate, more preferable examples include benzyl (meth)acrylate, benzyl (meth)acrylate having a substituent on the aromatic ring, and monofunctional (meth)acrylate compound having a naphthalene structure. Particularly preferable examples include 1- or 2-naphthyl (meth)acrylate, and 1- or 2-naphthylmethyl (meth)acrylate.

In the present invention, it is also preferable to use, as the polymerizable compound, multifunctional polymerizable unsaturated monomer having two or more ethylenic unsaturated bond-containing groups.

Examples of bifunctional polymerizable unsaturated monomer having two or more ethylenic unsaturated bond-containing groups, preferably used in the present invention, include diethylene glycol monoethyl ether (meth)acrylate, dimethyloldicyclopentane di(meth)acrylate, di(meth)acrylated isocyanurate, 1,3-butyrene glycol di(meth)acrylate, 1,4-butanediol di(meth)acrylate, EO-modified 1,6-hexanediol di(meth)acrylate, ECH-modified 1,6-hexanediol di(meth)acrylate, aryloxypolyethylene glycol acrylate, 1,9-nonanediol di(meth)acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified hexahydrophthalate diacrylate, neopentyl glycol hydroxypivalate di(meth)acrylate, neopentyl glycol di(meth)acrylate, EO-modified neopentyl glycol diacrylate, propylene oxide (referred to as "PO", hereinafter)-modified neopentyl glycol diacrylate, caprolactone-modified neopentyl glycol hydroxypivalate, stearic acid-modified pentaerythritol di(meth)acrylate, ECH-modified phthalate di(meth)acrylate, poly (ethylene glycol-tetramethylene glycol) di(meth)acrylate, poly(propylene glycol-tetramethylene glycol) di(meth)acrylate, polyester (di)acrylate, polyethylene glycol di(meth)acrylate, polypropylene glycol di(meth)acrylate, ECH-modified propylene glycol di(meth)acrylate, silicon di(meth)acrylate, triethylene glycol di(meth)acrylate, tetraethylene glycol di(meth)acrylate, dimethylol tricyclodecane di(meth)acrylate, neopentyl glycol-modified trimethylolpropane di(meth)acrylate, tripropylene glycol di(meth)acrylate, EO-modified tripropylene glycol di(meth)acrylate, triglycerol di(meth)acrylate, dipropylene glycol di(meth)acrylate, divinylethylene urea, divinylpropylene urea, o-, m-, p-xylylene di(meth)acrylate, 1,3-adamantane diacrylate, and norbornane dimethanol diacrylate.

Among them, particularly preferable for use in the present invention is bifunctional (meth)acrylate such as neopentyl glycol di(meth)acrylate, 1,9-nonanediol di(meth)acrylate, tripropylene glycol di(meth)acrylate, tetraethylene glycol di(meth)acrylate, neopentyl glycol hydroxypivalate di(meth)acrylate, polyethylene glycol di(meth)acrylate, o-, m-, p-benzene di(meth)acrylate, and o-, m-, p-xylylene di(meth)acrylate.

Examples of the multifunctional polymerizable unsaturated monomer having three or more ethylenic unsaturated bond-containing groups include ECH-modified glycerol tri(meth)acrylate, EO-modified glycerol tri(meth)acrylate, PO-modified glycerol tri(meth)acrylate, pentaerythritol triacrylate, EO-modified phosphoric triacrylate, trimethylolpropane tri(meth)acrylate, caprolactone-modified trimethylolpropane tri(meth)acrylate, EO-modified trimethylolpropane tri(meth)acrylate, PO-modified trimethylolpropane tri(meth)acrylate, tris(acryloxyethyl) isocyanurate, dipentaerythritol hexa(m- eth)acrylate, caprolactone-modified dipentaerythritol hexa(meth)acrylate, dipentaerythritol hydroxypenta(meth)acrylate, alkyl-modified dipentaerythritol penta(meth)acrylate, dipentaerythritol poly(meth)acrylate, alkyl-modified dipentaerythritol tri(meth)acrylate, ditrimethylolpropane tetra(meth)acrylate, pentaerythritolethoxy tetra(meth)acrylate, and pentaerythritol tetra(meth)acrylate.

Among them, particularly preferable for use in the present invention is trifunctional or higher functional (meth)acrylate such as EO-modified glycerol tri(meth)acrylate, PO-modified glycerol tri(meth)acrylate, trimethylolpropane tri(meth)acrylate, EO-modified trimethylolpropane tri(meth)acrylate, PO-modified trimethylolpropane tri(meth)acrylate, dipentaerythritol hexa(meth)acrylate, pentaerythritol ethoxytetra(meth)acrylate, and pentaerythritol tetra(meth)acrylate.

Among the multifunctional polymerizable unsaturated monomers having two or more ethylenic unsaturated bonds, multifunctional (meth)acrylate is preferably used in the present invention from the viewpoint of photo-curability. Note that the multifunctional (meth)acrylate herein is a general name for bifunctional (meth)acrylates and three or higher functional (meth)acrylates. Specific examples of the multifunctional (meth)acrylates include various multifunctional (meth)acrylates which were previously exemplified as the multifunctional polymerizable unsaturated monomer having two ethylenic unsaturated bonds, and as the multifunctional polymerizable unsaturated monomer having three or more ethylenic unsaturated bonds.

A compound having an oxirane ring (epoxy compound) is exemplified by polyglycidyl esters of polybasic acid, polyglycidyl ethers of polyhydric alcohol, polyglycidyl ethers of polyoxyalkylene glycol, polyglycidyl ethers of aromatic polyol, hydrogenated compounds of polyglycidyl ethers of aromatic polyol, urethane polyepoxy compound and epoxylated polybutadienes. Only a single species of these compounds may be used independently, or two or more species may be used in combination.

The compounds (epoxy compound) having an oxirane ring preferably used in the present invention are those described in paragraph [0053] of JP-A-2009-73078.

Among them, bisphenol A diglycidyl ether, bisphenol F diglycidyl ether, hydrogenated bisphenol A diglycidyl ether, hydrogenated bisphenol F diglycidyl ether, 1,4-butanediol diglycidyl ether, 1,6-hexanediol diglycidyl ether, glycerin triglycidyl ether, trimethylolpropane triglycidyl ether, neopentyl glycol diglycidyl ether, polyethylene glycol diglycidyl ether, and polypropylene glycol diglycidyl ether are particularly preferable.

Commercially available glycidyl group-containing compounds preferably used herein are those described in paragraph [0055] of JP-A-2009-73078. They may be used independently, or two or more species may be used in combination.

These compounds having an oxirane ring may be manufactured by arbitrary methods, and may be synthesized referring, for example, to literatures such as "*Jikken Kagaku Koza (The Course of Experimental Chemistry)*" 20, *Yukigosei (Organic* Synthesis) II, 4th Edition, 213-, 1992, Published by Maruzen Co., Ltd.; "*The Chemistry Of Heterocyclic Compounds-Small Ring Heterocycles, Part* 3 *Oxiranes*", Edited by Alfred Hassner, John & Wiley and Sons, AN Interscience Publication, New York, 1985; Yoshimura, *Secchaku*, Vol. 29, No. 12, 32, 1985; Yoshimura, *Secchaku*, Vol. 30, No. 5, 42, 1986; Yoshimura, *Secchaku*, Vol. 30, No. 7, 42, 1986; JP-A-H11-100378, Japanese Patent No. 2906245, and Japanese Patent No. 2926262.

Vinyl ether compound may be used as the other polymerizable compounds used in the present invention. The vinyl ether compound is arbitrarily selectable, typically from 2-ethylhexyl vinyl ether, butanediol-1,4-divinyl ether, diethylene glycol monovinyl ether, diethylene glycol monovinyl ether, ethylene glycol divinyl ether, triethylene glycol divinyl ether, 1,2-propanediol divinyl ether, 1,3-propanediol divinyl ether, 1,3-butanediol divinyl ether, 1,4-butanediol divinyl ether, tetramethylene glycol divinyl ether, neopentyl glycol divinyl ether, trimethylolpropane trivinyl ether, trimethylolethane trivinyl ether, hexanedioldivinyl ether, tetraethylene glycol divinyl ether, pentaerythritol divinyl ether, pentaerythritol trivinyl ether, pentaerythritol tetravinyl ether, solbitol tetravinyl ether, solbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, 1,1,1-tris[4-(2-vinyloxyethoxy)phenyl]ethane, and bisphenol A divinyloxyethyl ether.

These vinyl ether compounds are synthesized by a method described, for example, in Stephen. C. Lapin, *Polymers Paint Colour Journal.*, 179 (4237), 321 (1988), that is, a method based on a reaction of a polyhydric alcohol or polyhydric phenol with acetylene, or a reaction of a polyhydric alcohol or a polyhydric phenol with a halogenated alkyl vinyl ether. Only a single species of them may be used independently, or two or more species may be used in combination.

Also styrene derivative is usable as the polymerizable compound in the present invention. The styrene derivative is exemplified by styrene, p-methylstyrene, p-methoxystyrene, β-methyl styrene, p-methyl-β-methylstyrene, α-methylstyrene, p-methoxy-β-methylstyrene, and p-hydroxystyrene.

The curable composition for imprint of the present invention also preferably contains a polymerizable oligomer and/or polymerizable polymer which has a molecular weight still larger than that of the polymerizable compound, from the viewpoint of controlling resistance to dry etching, adequacy for imprinting, and curability. The polymerizable oligomer is exemplified by various acrylate oligomers such as polyester acrylate, urethane acrylate, polyether acrylate and epoxy acrylate. The amount of addition of the oligomer component is preferably 0 to 30% by mass, more preferably 0 to 20% by mass, furthermore preferably 0 to 10% by mass, and most preferably 0 to 5% by mass. The polymer component preferably has a polymerizable functional group in the side chain thereof. The polymer component preferably has a weight-average molecular weight of 2,000 to 100,000 from the viewpoint of compatibility with the polymerizable compound, and more preferably 5,000 to 50,000. The amount of addition of the polymer component is preferably 0 to 30% by mass relative to the components of the composition excluding the solvent, more preferably 0 to 20% by mass, furthermore preferably 0 to 10% by mass, and most preferably 2% by mass or less. The curable composition for imprint of the present invention will be improved in the pattern formability, when the content of the polymer component having a molecular weight of 2,000 or larger is 30% by mass or less in the components excluding the solvent.

The curable composition of the present invention may further contain a polymerizable compound having at least either one of fluorine atom and silicon atom. The curable composition of the present invention, however, more preferably contains substantially no polymerizable compound like this. For example, the ratio of content of the polymerizable compound which contains at least either one of fluorine atom and silicon atom, in the total polymerizable compounds contained in the curable composition, is preferably 2% by mass or less. The polymerizable compound in the present invention, having at least either one of fluorine atom and silicon atom, is a compound which has at least one group having fluorine atom, silicon atom, or, both of fluorine atom and silicon atom, and at least one polymerizable functional group. The polymerizable functional group is preferably a methacryloyl group or epoxy group.

While not specifically limited, the content of the polymerizable compound having at least either one of fluorine atom and silicon atom, in the curable composition for imprint of the present invention, is 0.1 to 20% by mass of the total polymerizable compounds, from the viewpoint of improving the curability and reducing the viscosity of the composition, more preferably 0.2 to 15% by mass, furthermore preferably 0.5 to 10% by mass, and particularly 0.5 to 5% by mass.

(1) Polymerizable Compound Having Fluorine Atoms

A group having fluorine atoms, owned by the polymerizable compound having fluorine atoms, is preferably a fluorine-containing group selected from fluoroalkyl group and fluoroalkyl ether group.

The fluoroalkyl group is preferably a $C_{2-20}$ fluoroalkyl group, and more preferably $C_{4-8}$ fluoroalkyl group. Preferable examples of the fluoroalkyl group include trifluoromethyl group, pentafluoroethyl group, heptafluoropropyl group, hexafluoroisopropyl group, nonafluorobutyl group, tridecafluorohexyl group, and heptadecafluorooctyl group.

In the present invention, the polymerizable compound having fluorine atoms is preferably a polymerizable compound having a trifluoromethyl group structure. By virtue of the trifluoromethyl group structure, the polymerizable compound having fluorine atoms can exhibit the effects of the present invention with only a small amount of addition (10% by mass or below, for example), so that the compatibility with the other component may be improved, the line edge roughness after dry-etched may be improved, and the repetitive patternability may be improved.

Similarly to the case of fluoroalkyl group, the fluoroalkyl ether group preferably has a trifluoromethyl group, wherein the one having perfluoroethylenoxy group or perfluoropropylenoxy group is preferable. The fluoroalkyl ether group is preferably a fluoroalkyl ether unit having a trifluoromethyl group such as $—(CF(CF_3)CF_2O)—$, and/or the one having a trifluoromethyl group at the terminal of the fluoroalkyl ether group.

The total number of fluorine atoms owned by the polymerizable compound having fluorine atoms is preferably 6 to 60 per molecule, more preferably 9 to 40, furthermore preferably 12 to 40, and particularly 12 to 20.

The polymerizable compound having fluorine atoms has a ratio of fluorine content of 20 to 60%. If the polymerizable compound having at least either one of fluorine atoms and silicon atoms is a polymerizable compound, the ratio of fluorine content is preferably 20 to 60%, and more preferably 35 to 60%. By adjusting the ratio of fluorine content in an appropriate range, the polymerizable compound will have a good compatibility with the other component, reduced in mold pollution, improved in the line edge roughness after dry etching, and improved in the repetitive patternability.

A fluorine atom-containing group in the polymerizable compound having fluorine atoms is exemplified by compounds having partial structure represented by the formula (I) below. By using the compound having this sort of partial structure, the curable composition will exhibit a good patternability even after repetitive pattern transfer, and will ensure a good long-term stability.

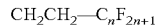  Formula (I)

In the formula (I), n represents an integer of 1 to 8, and preferably an integer of 4 to 6.

Other preferable examples of the polymerizable compound having fluorine atoms include the compound having a partial structure represented by the formula (II) below. The compound may, of course, have both of the partial structure represented by the formula (I), and the partial structure represented by the formula (II).

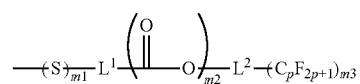  Formula (II)

In the formula (II), $L^2$ represents a single bond or $C_{1-8}$ alkylene group, $L^2$ represents a $C_{1-8}$ alkylene group, each of m1 and m2 independently represents 0 or 1, and at least one of m1 and m2 is 1. m3 represents an integer of 1 to 3, and p represents an integer of 1 to 8. When m3 is 2 or larger, the individual $(—C_pF_{2p+1})$s may be same or different.

It is preferable that each of $L^1$ and $L^2$ independently represents a $C_{1-4}$ alkylene group. The alkylene group may have a substituent without departing from the spirit of the present invention. m3 is preferably 1 or 2. p is preferably an integer of 4 to 6.

Specific examples of the polymerizable compound having fluorine atoms, used for the photo-curable composition used in the present invention, will be shown below without limiting the present invention.

The polymerizable compound having fluorine atoms is exemplified by monofunctional polymerizable compound having fluorine atoms, such as trifluoroethyl (meth)acrylate, pentafluoroethyl (meth)acrylate, (perfluorobutyl)ethyl (meth)acrylate, perfluorobutyl-hydroxypropyl (meth)acrylate, (perfluorohexyl)ethyl (meth)acrylate, octafluoropentyl (meth)acrylate, perfluorooctylethyl (meth)acrylate, tetrafluoropropyl (meth)acrylate, and hexafluoropropyl (meth)acrylate. As the polymerizable compound having fluorine atoms, also preferably exemplified are multi-functional polymerizable compounds having two or more polymerizable functional groups, which contain di(meth)acrylate having fluoroalkylene groups, such as 2,2,3,3,4,4-hexafluoropentane di(meth)acrylate and 2,2,3,3,4,4,5,5-octafluorohexane di(meth)acrylate.

Also compounds having two or more fluorine-containing groups in one molecule, such as fluoroalkyl group or fluoroalkyl ether group, are preferably used.

The compounds having two or more fluoroalkyl groups or fluoroalkyl ether groups in one molecule are preferably polymerizable compounds represented by the formula (III) below:

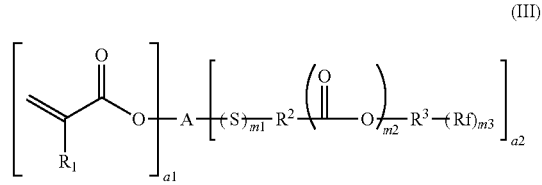  (III)

(in the formula (III), $R^1$ represents a hydrogen atom, alkyl group, halogen atom or cyano group, preferably represents a hydrogen atom or alkyl group, more preferably represents a hydrogen atom or methyl group, and furthermore preferably represents a hydrogen atom.

"A" represents an (a1+a2)-valent linking group, preferably represents a linking group having an alkylene group and/or arylene group, and may further contain a linking group having a hetero atom. The linking group having a hetero atom is exemplified by —O—, —C(=O) O—, —S— and —C(=O)—. While these groups may have a substituent without departing from the spirit of the present invention, they preferably have no substituent. "A" preferably has 2 to 50 carbon atoms, and more preferably has 4 to 15 carbon atoms.

a1 represents an integer of 1 to 6, preferably 1 to 3, and furthermore preferably 1 or 2.

a2 represents an integer of 2 to 6, preferably 2 or 3, and furthermore preferably 2.

Each of $R^2$ and $R^3$ independently represents a single bond or $C_{1-8}$ alkylene group. Each of m1 and m2 independently represents 0 or 1, and m3 represents an integer of 1 to 3.)

When a1 is 2, the individual (A)s may be same or different.
When a2 is 2, the individual ($R^2$)s, ($R^3$)s, (m1)s, (m2)s and (m3)s, respectively, may be same or different.

Rf represents a fluoroalkyl group or fluoroalkyl ether group, and preferably represents a $C_{1-8}$ fluoroalkyl group, or $C_{3-20}$ fluoroalkyl ether group.

(2) Polymerizable Compound Having Silicon Atom(s)

Functional group having silicon atom(s), owned by the polymerizable compound having silicon atom(s), is exemplified by trialkylsilyl group, chain-like siloxane structure, cyclic siloxane structure, and basket-like siloxane structure. From the viewpoints of compatibility with other component and mold releasability, functional groups having a trimethylsilyl group or dimethylsiloxane structure are preferable.

The polymerizable compound having silicon atom(s) is exemplified by 3-tris(trimethylsilyloxy)silylpropyl (meth)acrylate, trimethylsilylethyl (meth)acrylate, (meth)acryloxymethyl bis(trimethylsiloxy)methylsilane, (meth)acryloxymethyl tris(trimethylsiloxy)silane, 3-(meth)acryloxypropyl bis(trimethylsiloxy)methylsilane, and polysiloxane having a (meth)acryloyl group at the terminal or in the side chain (for example, X-22-164 Series, X-22-174DX, X-22-2426 and X-22-2475 from Shin-Etsu Chemical Co., Ltd.).

Besides them, the polymerizable compound usable in the present invention also includes propenyl ether and butenyl ether. The propenyl ether and butenyl ether are exemplified by 1-dodecyl-1-propenyl ether, 1-dodecyl-1-butenyl ether, 1-butenoxymethyl-2-norbornene, 1-4-di(1-butenoxy)butane, 1,10-di(1-butenoxy)decane, 1,4-di(1-butenoxymethyl)cyclohexane, diethylene glycol di(1-butenyl) ether, 1,2,3-tri(1-butenoxy)propane, and propenyl ether propylene carbonate.

Also a series of polymerizable compounds represented by the formula (I) are exemplified as the polymerizable compound used in the present invention.

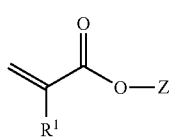

(I)

(In the formula (I), Z represents a group containing an aromatic group and having a molecular weight of 100 or larger, and $R^1$ represents a hydrogen atom, alkyl group or halogen atom. If the polymerizable compound (Ax) is a liquid at 25° C., the viscosity at 25° C. is 500 mPa·s or smaller.)

$R^1$ preferably represents a hydrogen atom or alkyl group, wherein hydrogen atom or methyl group is preferable. From the viewpoint of curability, hydrogen atom is more preferable. The halogen atom is exemplified by fluorine atom, chlorine atom, bromine atom and iodine atom, among them fluorine atom is preferable.

Z preferably represents an aralkyl group which may have a substituent, aryl group which may have a substituent, or, a group configured by any of these groups bound via a linking group. The linking group referred to herein may contain a hetero atom-containing linking group, and is preferably —CH$_2$—, —O—, —C(=O)—, —S— or groups configured by combining any of them. The aromatic group contained in Z is preferably a phenyl group, wherein it is preferable that only phenyl group is contained. As compared with the polymerizable compounds having polycyclic aromatic group and heteroaromatic group, those having only phenyl group will have lower viscosity, better formability of patterns, and will be able to suppress particle defects. Z preferably has a molecular weight of 100 to 300, and more preferably 120 to 250.

The number of polymerizable groups and the number of aromatic groups, contained in the polymerizable compound, preferably satisfies (number of polymerizable groups)(number of aromatic groups), from the viewpoint of viscosity and dry etching resistance. In this case, a condensed aromatic ring such as naphthalene is counted as a single aromatic group, whereas two aromatic rings linked via a bond such as biphenyl is counted as two aromatic groups.

The polymerizable compound, given in the form of liquid at 25° C., preferably has a viscosity at 25° C. of 2 to 500 mPa·s, more preferably 3 to 200 mPa·s, and most preferably 3 to 100 mPa·s. The polymerizable compound is preferably a liquid at 25° C., or otherwise a solid having a melting point of 60° C. or lower. The form of liquid at 25° C. is more preferable.

Z is preferably a group represented by —$Z^1$—$Z^2$. $Z^1$ now represents a single bond, or a hydrocarbon group which may have in the chain thereof a hetero atom-containing linking group. $Z^2$ is an aromatic group which may have a substituent, and has a molecular weight of 90 or larger.

$Z^1$ is preferably a single bond, or an alkylene group which may have in the chain thereof a hetero atom-containing linking group. $Z^1$ more preferably represents an alkylene group which has in the chain thereof no hetero atom-containing linking group, and is furthermore preferably a methylene group or ethylene group. The hetero atom-containing linking group is exemplified by —O—, —C(=O)—, —S—, and groups configured by combining them with an alkylene group. The hydrocarbon group preferably has 1 to 3 carbon atoms.

$Z^2$ is preferably an aromatic group having a substituent with a molecular weight of 15 or larger. The aromatic group contained in $Z^2$ is exemplified by phenyl group and naphthyl group, and more preferably exemplified by phenyl group having a substituent with a molecular weight of 15 or larger. $Z^2$ is more preferably configured by a monocyclic aromatic group.

$Z^2$ is also preferably a group configured by two or more aromatic groups bound directly, or via a linking group. Also the linking group in this case is preferably a group configured by —CH$_2$—, —O—, —C(=O)—, —S— or combinations of them.

The substituent which may be owned by the aromatic group is exemplified by halogen atom (fluorine atom, chlorine atom, bromine atom, iodine atom), straight-chain, branched or cyclic alkyl group, alkenyl group, alkynyl group, aryl group, acyl group, alkoxycarbonyl group, aryloxycarbonyl group, carbamoyl group, cyano group, carboxy group, hydroxy group, alkoxy group, aryloxy group, alkylthio group, arylthio group, heterocyclic oxy group, acyloxy group, amino group, nitro group, hydrazino group and heterocyclic group. Also groups further substituted by these groups are preferable.

The amount of addition of the compound represented by the formula (I) in the photo-curable composition is preferably 10 to 100% by mass, more preferably 20 to 100% by mass, and particularly 30 to 80% by mass.

The compound represented by the formula is preferably a compound represented by the formula (II) below.

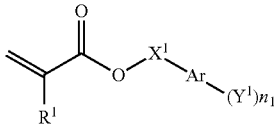

(II)

(In the formula (II), $R^1$ represents a hydrogen atom, alkyl group or halogen atom, and $X^1$ represents a single bond or hydrocarbon group. The hydrocarbon group may contain in the chain thereof a hetero atom-containing linking group. $Y^1$ represents a substituent with a molecular weight of 15 or larger, and n1 represents an integer of 0 to 3. When n1 is 0, then $X^1$ represents a $C_2$ or longer hydrocarbon group. Ar represents an aromatic group or aromatic linking group, wherein phenyl group or phenylene group is preferable.)

$R^1$ is synonymous to $R^1$ in the formula above, again with the same preferable ranges.

$X^1$ is synonymous to $Z^1$ described above, with the same preferable ranges.

$Y^1$ represents a substituent with a molecular weight of 15 or larger, and is exemplified by alkyl group, alkoxy group, aryloxy group, aralkyl group, acyl group, alkoxycarbonyl group, alkylthio group, arylthio group and halogen atom. These substituents may have additional substituents.

When n1 is 0, $X^1$ preferably represents a $C_2$ or $C_3$ alkylene group, meanwhile when n1 is 2, $X^1$ preferably represents a single bond or $C_1$ hydrocarbon group.

In one particularly preferable embodiment, n1 is 1, and $X^1$ represents a $C_{1-3}$ alkylene group.

The compound represented by the formula (II) is furthermore preferably a compound represented by the formula (III).

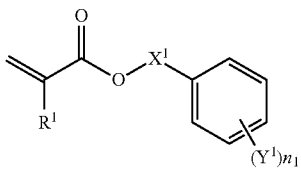

(III)

(In the formula (III), $R^1$ represents a hydrogen atom, alkyl group or halogen atom. $X^1$ represents a single bond, or hydrocarbon group which may contain in the chain thereof a hetero atom-containing linking group. $Y^1$ represents a substituent with a molecular weight of 15 or larger, and n1 represent an integer of 0 to 3. When n1 is 0, $X^1$ then represents a $C_2$ or longer hydrocarbon group.)

$R^1$ is synonymous to $R^1$ in the formula above, again with the same preferable ranges.

$X^1$ is synonymous to $Z^1$ described above, with the same preferable ranges.

$Y^1$ is synonymous to $Y^1$ in the formula (II) above, again with the same preferable ranges.

n1 is synonymous to n1 in formula (II) above, again with the same preferable ranges.

The compound represented by the formula (III) is furthermore preferably a compound represented by any of the formulae (IV) to (VI) below.

Compound Represented by Formula (IV)

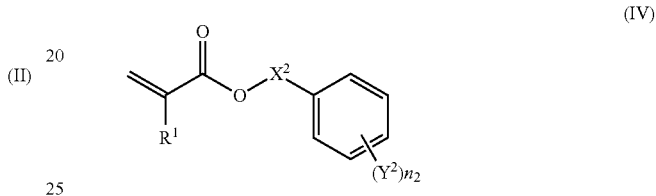

(IV)

(In the formula (IV), $R^1$ represents a hydrogen atom, alkyl group or halogen atom. $X^2$ represents a single bond, or hydrocarbon group which may contain in the chain thereof a hetero atom-containing linking group. $Y^2$ represents a substituent containing no aromatic group with a molecular weight of 15 or larger, and n2 represents an integer of 0 to 3. Note that when n2 is 0, then $X^2$ represents a $C^2$ or $C_3$ hydrocarbon group.)

$R^1$ is synonymous to $R^1$ in the formula above, again with the same preferable ranges.

$X^2$, when representing a hydrocarbon group, is preferably a $C_{1-3}$ hydrocarbon group, preferably a substituted or unsubstituted $C_{1-3}$ alkylene group, and more preferably an unsubstituted $C_{1-3}$ alkylene group or ethylene group. By using the hydrocarbon group like this, the photo-curable composition will now be lower in viscosity and lower in volatility.

$Y^2$ represents a substituent having no aromatic group with a molecular weight of 15 or larger, wherein the upper limit of the molecular weight of $Y^1$ is preferably 80 or smaller. $Y^2$ is preferably represented by $C_{1-6}$ alkyl groups such as methyl group, ethyl group, isopropyl group, tert-butyl group and cyclohexyl group; halogen atoms such as chloro group and bromo group; and $C_{1-6}$ alkoxy group such as methoxy group, ethoxy group, and cyclohexyloxy group.

n2 is preferably an integer of 0 to 2. When n2 is 1, the substituent Y is preferably bound to the para position. From the viewpoint of viscosity, when n2 is 2, then $X^2$ is preferably a single bond or $C_1$ hydrocarbon group.

The compound represented by the formula (IV) is preferably a monofunctional (meth)acrylate having one (meth)acrylate group.

From the viewpoint of balancing low viscosity and low volatility, the (meth)acrylate compound represented by the formula (IV) preferably has a molecular weight of 175 to 250, and more preferably 185 to 245.

The (meth)acrylate compound represented by the formula (IV) preferably has a viscosity at 25° C. of 10 mPa·s or smaller, and more preferably 6 mPa·s or smaller.

The compound represented by the formula (IV) is also preferably usable as a reactive diluent.

The amount of addition of the compound represented by the formula (IV) in the photo-curable composition is preferably 10% by mass or more, from the viewpoint of viscosity of the composition and accuracy of the cured pattern, more preferably 15% by mass or more, and particularly 20% by mass or more. Meanwhile, from the viewpoint of tackiness after the curing and mechanical strength, the amount of addition is preferably 95% by mass or less, more preferably 90% by mass or less, and particularly 85% by mass or less.

Compounds represented by the formula (IV) will be shown below, of course without limiting the present invention. $R^1$ represents a hydrogen atom, alkyl group or halogen atom.

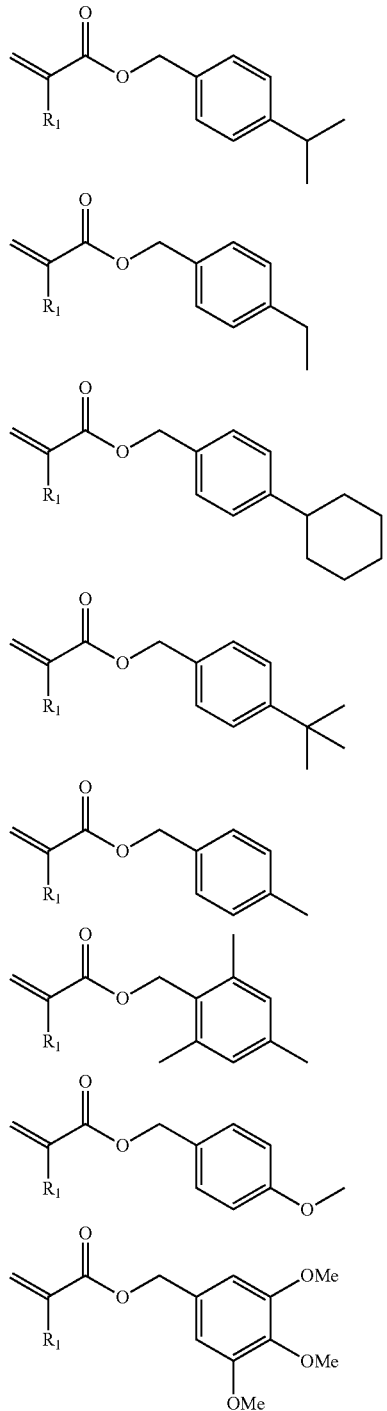

-continued

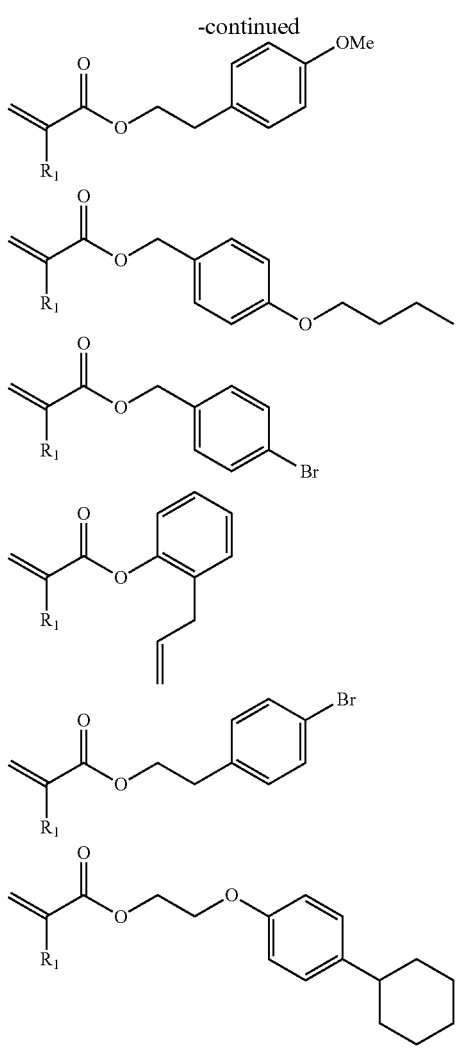

Compound Represented by Formula (V)

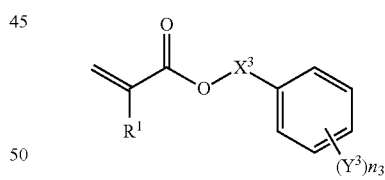

(V)

(In the formula (V), $R^1$ represents a hydrogen atom, alkyl group or halogen atom, and $X^3$ represents a single bond, or hydrocarbon group which may contain in the chain thereof a hetero atom-containing linking group. $Y^3$ represents a substituent having an aromatic group with a molecular weight of 15 or larger, and n3 represents an integer of 1 to 3.)

$R^1$ is synonymous to $R^1$ in the formula above, again with the same preferable ranges.

$X^1$ is synonymous to $Z^1$ described above, again with the same preferable ranges.

$Y^3$ represents a substituent having an aromatic group with a molecular weight of 15 or larger, wherein the substituent having the aromatic group is preferably configured by an aromatic group bound via a single bond or a linking group to the aromatic ring in the formula (V). The linking group is preferably exemplified by alkylene group, linking group having a hetero atom (preferably —O—, —S—, —CO(=O)—), and combinations of them. Alkylene group, —O—, and groups configured by combining them are more preferable. The substituent having an aromatic group with a molecular weight of 15 or larger is preferably a substituent having a phenyl group. The phenyl group is preferably bound via a single bond or the linking group. Particularly preferable examples include phenyl group, benzyl group, phenoxy group, benzyloxy group and phenylthio group. The formula weight of $Y^3$ is preferably 230 to 350.

n3 preferably represents 1 or 2, and more preferably 1.

The amount of addition of the compound represented by the formula (V) in the composition is preferably 10% by mass or more, more preferably 20% by mass or more, and particularly 30% by mass or more. On the other hand, from the viewpoint of tackiness after the curing and mechanical strength, the amount of addition is preferably 90% by mass or less, more preferably 80% by mass or less, and particularly 70% by mass or less.

Compounds represented by the formula (V) will be shown below, of course without limiting the present invention. $R^1$ represents a hydrogen atom, alkyl group or halogen atom.

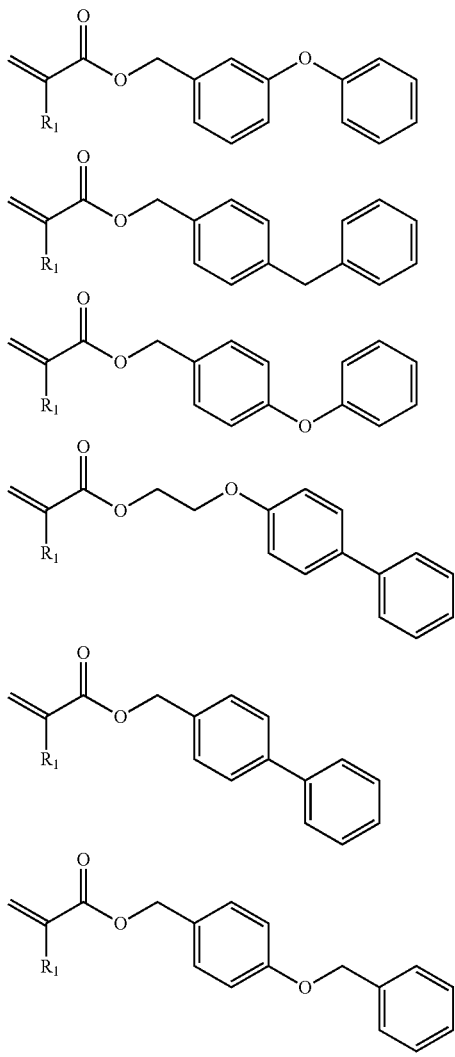

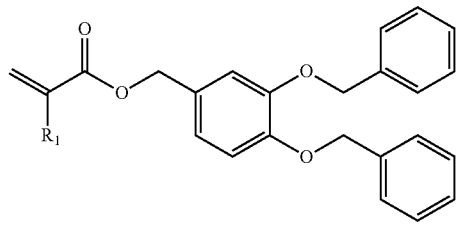

Compound Represented by Formula (VI)

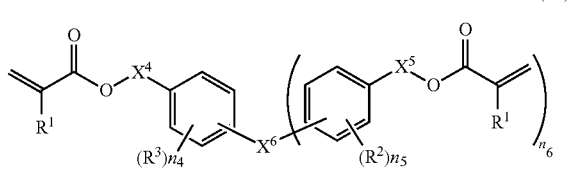

(In the formula (VI), $X^6$ represents an (n6+1)-valent linking group, and each $R^1$ independently represents a hydrogen atom, alkyl group or halogen atom. Each of $R^2$ and $R^3$ independently represents a substituent, and each of n4 and n5 independently represents an integer of 0 to 4. n6 represents 1 or 2, and each of $X^4$ and $X^5$ independently represents a hydrocarbon group which may contain in the chain thereof a hetero atom-containing linking group.)

$X^6$ represents a (n6+1)-valent linking group, and preferably alkylene group, —O—, —S—, —CO(=O)—, or a linking group configured by some of them. The alkylene group is preferably a $C_{1-8}$ alkylene group, and more preferably a $C_{1-3}$ alkylene group. Unsubstituted alkylene group is preferable.

n6 preferably represents 1. When n6 is 2, each of a plurality of $R^1$, $X^5$ and $R^2$ may be same or different.

Each of $X^4$ and $X^5$ independently represents an alkylene group which contains no linking group, more preferably a $C_{1-5}$ alkylene group, furthermore preferably a $C_{1-3}$ alkylene group, and most preferably a methylene group.

$R^1$ is synonymous to $R^1$ in the formula, again with the same preferable ranges.

Each of $R^2$ and $R^3$ independently represents a substituent, which is preferably an alkyl group, halogen atom, alkoxy group, acyl group, acyloxy group, alkoxycarbonyl group, cyano group, or nitro group. The alkyl group is preferably a $C_{1-8}$ alkyl group. The halogen atom is exemplified by fluorine atom, chlorine atom, bromine atom and iodine atom, wherein fluorine atom is preferable. The alkoxy group is preferably a $C_{1-8}$ alkoxy group. The acyl group is preferably a $C_{1-8}$ acyl group. The acyloxy group is preferably a $C_{1-8}$ acyloxy group. The alkoxycarbonyl group is preferably a $C_{1-8}$ alkoxycarbonyl group.

Each of n4 and n5 independently represents an integer of 0 to 4. When n4 or n5 is 2 or larger, each of a plurality of $R^2$ and $R^3$ may be same or different.

The compound represented by the formula (VI) is preferably a compound represented by the formula (VII) below.

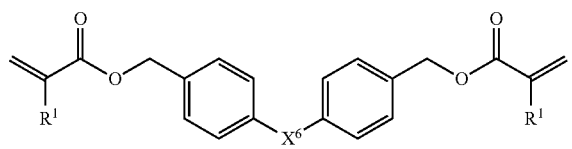

($X^6$ represents an alkylene group, —O—, —S—, or a linking group configured by combining some of them, and each $R^1$ independently represents a hydrogen atom, alkyl group or halogen atom.)

$R^1$ is synonymous to $R^1$ in the formula, again with the same preferable ranges.

$X^6$, when representing an alkylene group, is preferably a $C_{1-8}$ alkylene group, and more preferably a $C_{1-3}$ alkylene group. Also an unsubstituted alkylene group is preferable.

$X^6$ is preferably —$CH_2$—, —$CH_2CH_2$—, —O— or —S—.

While not specifically limited, the content of the compound represented by the formula (VI) in the photo-curable composition used in the present invention is preferably 1 to 100% by mass of the total polymerizable compounds, from the viewpoint of curability and viscosity of the composition, more preferably 5 to 70% by mass, and particularly 10 to 50% by mass.

The compounds represented by the formula (VI) will be shown below, of course without limiting the present invention. Each $R^1$ in the formulae below is synonymous to $R^1$ in the formula (VI), with the same preferable ranges. Hydrogen atom is particularly preferable.

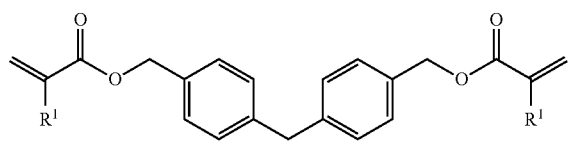

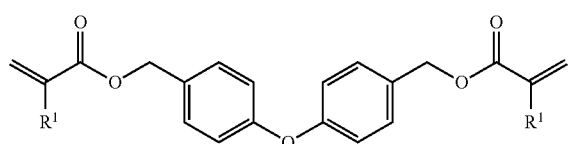

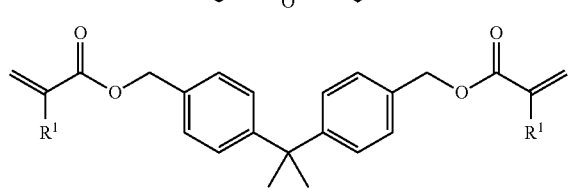

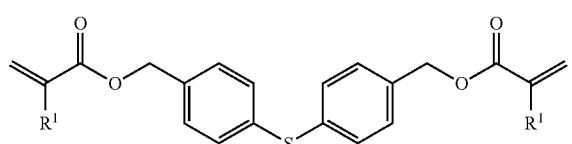

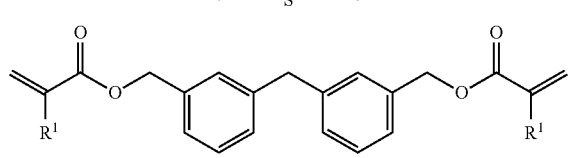

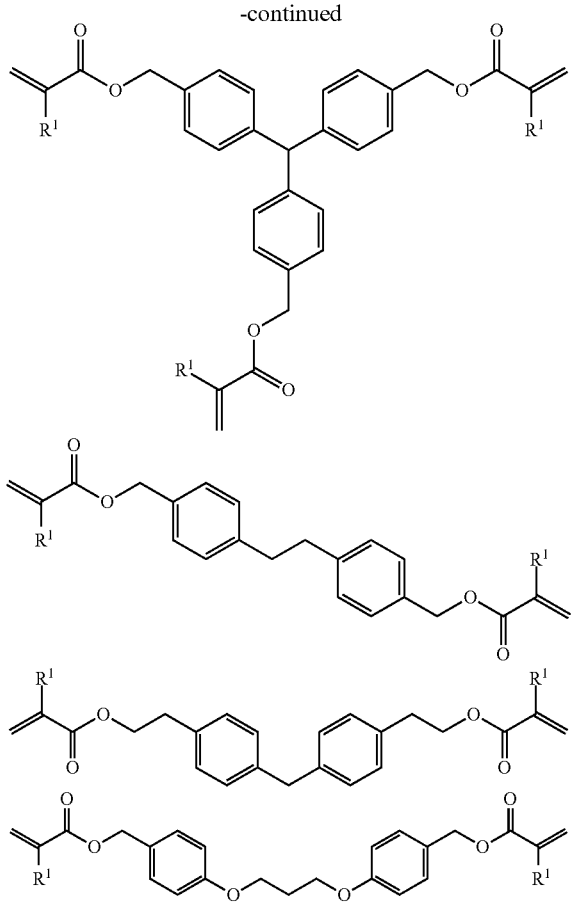

Furthermore, also a group of polymerizable compounds represented by the formula below are exemplified as the polymerizable compound usable in the present invention.

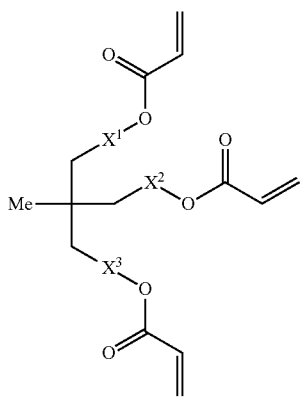

(In the formula, each of $X^1$ to $X^3$ independently represents a single bond or linking group. Me represents a methyl group.)

Each of $X^1$ to $X^3$, when representing a linking group, is preferably an organic linking group, and more preferably a $C_{1-50}$ organic linking group. The organic linking group is specifically exemplified by oxyalkylene group, —O—C(=O)—, alkylene group and groups composed of two or more of them. The oxyalkylene group is exemplified by ethylene oxide group and propylene oxide group. The alkylene group is exemplified by propylene group, butyrene group, pentyl group and hexyl group. Each of $X^1$ to $X^3$ is preferably a single bond.

The compound represented by the formula is preferably a liquid at 25° C., but not always necessarily.

Specific examples of the polymerizable compound in the present invention will be shown below.

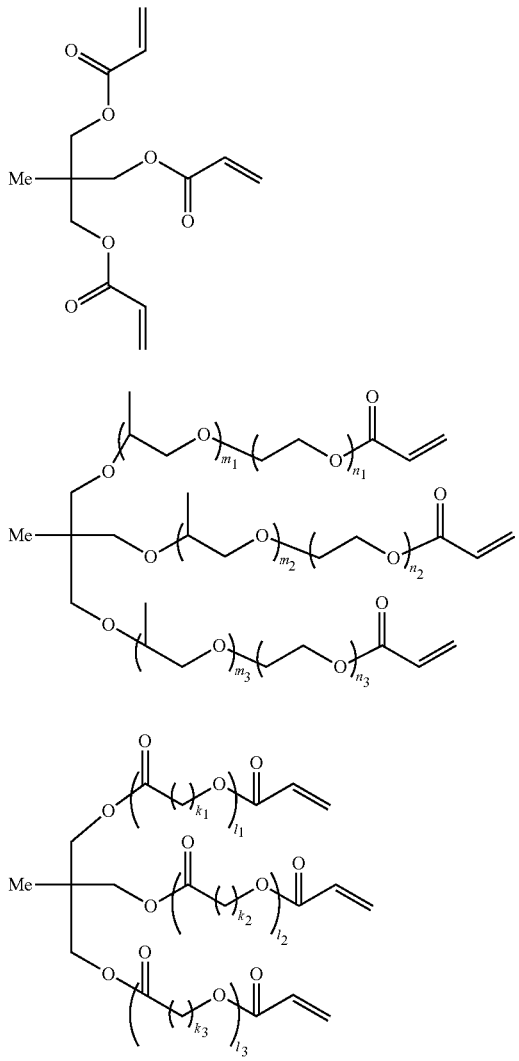

Each of $m^1$, $m^2$, $m^3$, $n^1$, $n^2$ and $n^3$ independently represents an integer of 0 to 10. The polymerizable compound is a compound having a total of m and $n^3$ larger $m^1$, $m^2$, $m^3$, $n^1$, n2 and $n^3$ larger than 1, or a mixture having an average of the total values larger than 1.

Each of $l^1$, $l^2$, $l^3$ independently represents an integer of 0 to 10, and each of $k^1$, $k^2$, $k^3$ independently represents an integer of 3 to 6. The polymerizable compound is a compound having a total of $l^1$, $l^2$ and $l^3$ of larger than 1, or a mixture having an average of the total values of larger than 1.

Also a group of polymerizable compound represented by the formula below is exemplified as the polymerizable compound usable in the present invention.

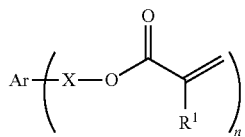

[In the formula, Ar represents an arylene group which may have a substituent, X represents a single bond or organic linking group, $R^1$ represents a hydrogen atom or methyl group, and n represents 2 or 3.]

In the formula, the arylene group is exemplified by hydrocarbon-based arylene groups such as phenylene group and naphthylene group; and heteroarylene groups having indole or carbazole as the linking group. The arylene group is preferably hydrocarbon-based arylene group, and more preferably phenylene group from the viewpoint of etching resistance. The arylene group may have a substituent, wherein preferable examples of the substituent include alkyl group, alkoxy group, hydroxy group, cyano group, alkoxycarbonyl group, amide group, and sulfonamide group.

The organic linking group represented by X is exemplified by alkylene group which may have a hetero atom in the chain thereof, arylene group, and aralkylene group. Among them, alkylene group and oxyalkylene group are preferable, and alkylene group is more preferable. It is particularly preferable for X to represent a single bond or alkylene group.

$R^1$ represents a hydrogen atom or methyl group, and preferably a hydrogen atom.

n represents 2 or 3, and preferably 2.

The polymerizable compound is preferably any of those represented by the formulae (I-a) and (I-b) below, from the viewpoint of decreasing viscosity of the composition.

Formula (I-a)

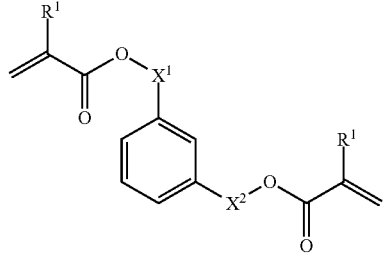

Formula (I-b)

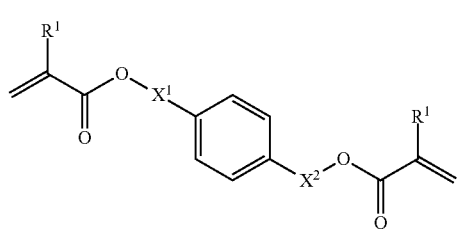

[In the formulae, each of $X^1$ and $X^2$ independently represents a single bond or alkylene group which may have a $C_{1-3}$ substituent, and $R^1$ represents a hydrogen atom or methyl group.]

In the formula (I-a), $X^1$ preferably represents a single bond or methylene group, and more preferably represents a methylene group from the viewpoint of reducing the viscosity.

Preferable range of $X^2$ is same as that of $X^1$.

$R^1$ is synonymous to $R^1$ in the formula (I), with the same preferable ranges.

The polymerizable compound is preferably a liquid at 25° C., since it will suppress insoluble matters from generating even under an increased amount of addition.

Specific examples of preferable polymerizable compound will be shown below. $R^1$ is synonymous to $R^1$ in the formula, and represents a hydrogen atom or methyl group. The present invention is, however, not limited to the specific examples below.

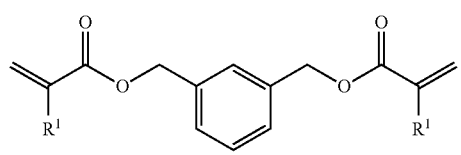

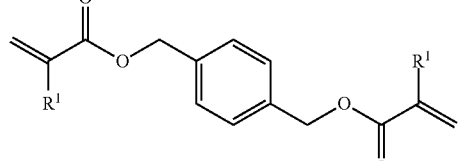

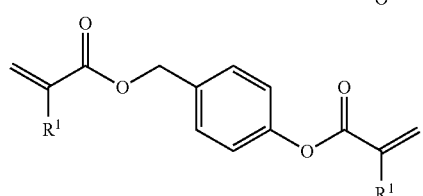

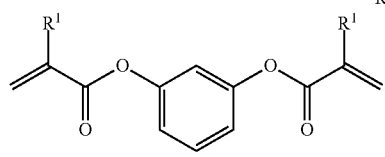

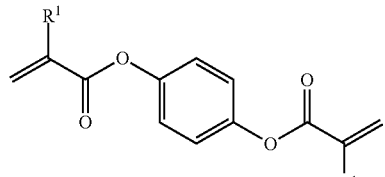

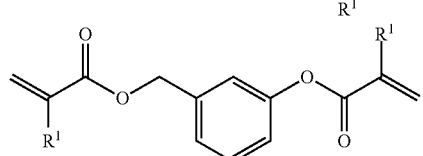

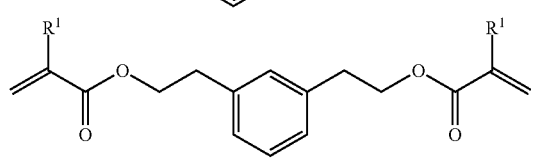

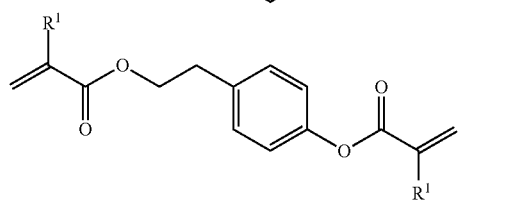

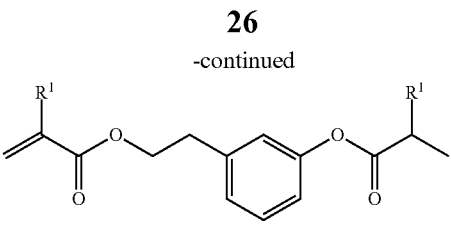

-continued

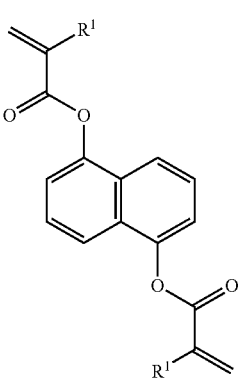

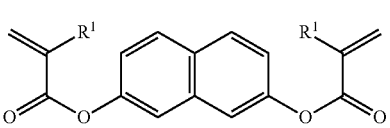

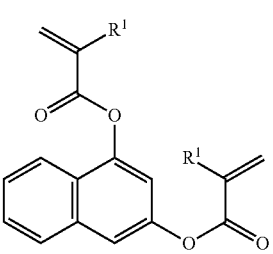

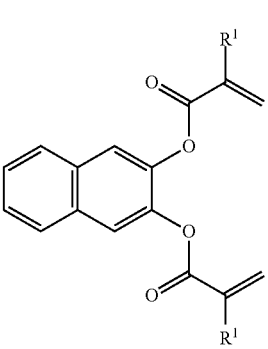

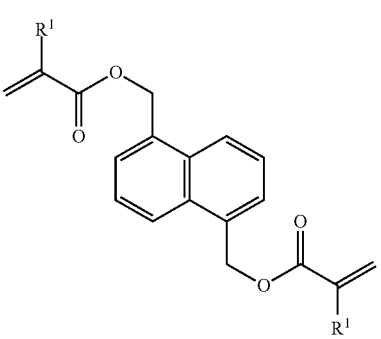

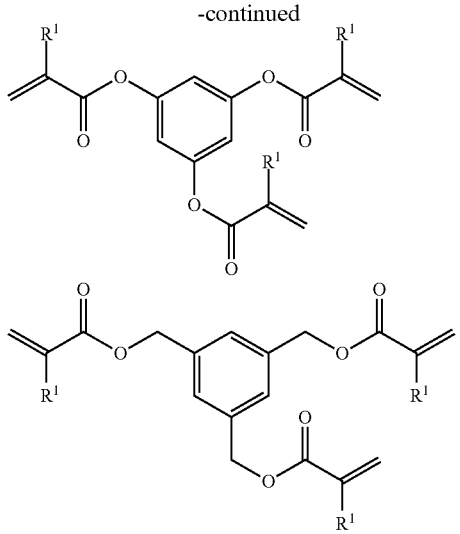

Among these polymerizable compounds, (A) polymerizable compound is preferably a (meth)acrylate compound from the viewpoint of viscosity of the composition and photocurability, wherein acrylate is more preferable. In the present invention, also multifunctional polymerizable compound having two or more polymerizable functional groups is preferable.

In the present invention, it is particularly preferable to adjust the ratio of mixing of the monofunctional (meth)acrylate compound and the multifunctional (meth)acrylate compound to 80/20 to 0/100 on the weight basis, more preferably 70/30 to 0/100, and furthermore preferably 40/60 to 0/100. By selecting an appropriate ratio, the composition will successfully have a sufficient level of curability and low viscosity.

In the multifunctional (meth)acrylate compound, the ratio of content of the bifunctional (meth)acrylate and the trifunctional or higher functional (meth)acrylate is preferably 100/0 to 20/80 on the mass basis, more preferably 100/0 to 50/50, and furthermore preferably 100/0 to 70/30. Since the trifunctional or higher functional (meth)acrylate has the viscosity larger than that of the bifunctional (meth)acrylate, so that the curable composition for imprint of the present invention may advantageously be reduced in viscosity, as the content of the bifunctional (meth)acrylate becomes larger.

The (A) polymerizable compound preferably contains a compound which contains a substituent having an aromatic structure and/or alicyclic hydrocarbon structure from the viewpoint of etching resistance, wherein the content of the polymerizable compound having an aromatic structure and/or alicyclic hydrocarbon structure is more preferably 50% by mass or more in the (A) component, and furthermore preferably 80% by mass or more. The polymerizable compound having an aromatic structure is preferably an (meth)acrylate compound having an aromatic structure. Particularly preferable examples of the (meth)acrylate compound having an aromatic structure include monofunctional (meth)acrylate compounds having a naphthalene structure, such as 1- or 2-naphthyl (meth)acrylate, 1- or 2-naphthylmethyl (meth)acrylate, and 1- or 2-naphthylethyl (meth)acrylate; monofunctional acrylates such as benzyl acrylate having a substituent on the aromatic ring; and bifunctional acrylates such as catechol diacrylate, and xylylene glycol diacrylate. The polymerizable compound having an alicyclic hydrocarbon structure is preferably isoboronyl (meth)acrylate, dicyclopentanyl (meth)acrylate, dicyclopentanyloxyethyl (meth)acrylate, dicyclopentenyl (meth)acrylate, adamantyl (meth)acrylate, tricyclodecanyl (meth)acrylate, or tetracyclododecanyl (meth)acrylate.

When the (meth)acrylates are used as the (A) polymerizable compound, acrylates are preferred over methacrylates.

It is particularly preferable for the curable composition for imprint of the present invention to contain, as the (A) polymerizable compound, both of the (meth)acrylate compound having an aromatic structure and the fluorine atom-containing (meth)acrylate. As for the ratio of content, it is preferable that the (meth)acrylate compound having an aromatic structure accounts for 80% by mass or more of the total (A) polymerizable compound component, and the fluorine atom-containing (meth)acrylate accounts for 0.1 to 10% by mass. Particularly preferable is a blended system configured by the (meth)acrylate compound having an aromatic structure which exists as a liquid at 1 atm at 25° C., and the fluorine atom-containing (meth)acrylate which is a solid at 1 atom at 25° C.

The total content of the (A) polymerizable compound in the curable composition for imprint of the present invention is preferably 50 to 99.5% by mass in the whole components excluding the solvent, from the viewpoint of improving the curability and of improving the viscosity of the curable composition for imprint of the present invention, more preferably 70 to 99% by mass, and particularly 90 to 99% by mass.

In the (A) polymerizable compound component in the curable composition for imprint of the present invention, preferably the polymerizable compound having a viscosity at 25° C. of 3 to 100 mPa·s accounts for 80% by mass or more of the total polymerizable compounds, more preferably the polymerizable compound having a viscosity of 3 to 70 mPa·s accounts for 80% by mass or more, furthermore preferably the polymerizable compound having a viscosity of 7 to 50 mPa·s accounts for 80% by mass or more, and most preferably the polymerizable compound having a viscosity of 8 to 30 mPa·s accounts for 80% by mass or more.

In the (A) polymerizable compound contained in the curable composition for imprint of the present invention, the polymerizable compound which exists as a liquid at 25° C. preferably accounts for 50% by mass or more in the total polymerizable compounds, from the viewpoint of stability over time.

(B) Photo-Polymerization Initiator

The curable composition for imprint of the present invention contains a photo-polymerization initiator. The photo-polymerization initiator used in the present invention is arbitrarily selectable from those capable of producing an active species, which acts to polymerize the (A) polymerizable compound, upon being irradiated with light. The photo-polymerization initiator is exemplified by cationic polymerization initiator, and radical polymerization initiator, wherein the radical polymerization initiator is preferable. In the present invention, a plurality of species of the photo-polymerization initiator may be used in combination.

Content of the photo-polymerization initiator used in the present invention typically accounts for 0.01 to 15% by mass, preferably 0.1 to 12% by mass, and furthermore preferably 0.2 to 7% by mass of the whole components excluding the solvent. For the case where two or more species of the photo-polymerization initiator are used, the total content falls in the above-described ranges.

A content of the photo-polymerization initiator of 0.01% by mass or more is preferable, since the sensitivity (rapid curability), resolution, line edge roughness performance, and film strength tend to improve. On the other hand, a content of the photo-polymerization initiator of 15% by mass or less is preferable, since the translucency, coloration and handleability tend to improve. In the system containing dye and/or pigment, they may act as a radical trapping agent, and may adversely affect the photo-polymerization performance and sensitivity. Taking this point into consideration, the amount of addition of the photo-polymerization initiator is optimized for these applications. On the other hand, the dye and/or pigment are not essential components for the composition used in the present invention, so that the optimum range of the photo-polymerization initiator may be different from that in the field of curable composition for color filters in liquid crystal display devices.

The radical photo-polymerization initiator used in the present invention is selectable, for example, from those commercially available. The examples include those described, for example, in paragraph [0091] of JP-A-2008-105414, which are preferably used. Among them, acetophenone-based compound, acylphosphine oxide-based compound, and oxime ester-based compound are preferable from the viewpoints of curing sensitivity and absorption characteristics.

The acetophenone-based compound is preferably exemplified by hydroxyacetophenone-based compound, dialkoxyacetophenone-based compound, and aminoacetophenone-based compound. The hydroxyacetophenone-based compound is preferably exemplified by Irgacure (registered trademark) 2959 (1-[4-(2-hydroxyethoxy)phenyl]-2-hydroxy-2-methyl-1-pro pane-1-one, Irgacure (registered trademark) 184 (1-hydroxycyclohexyl phenylketone), Irgacure (registered trademark) 500 (1-hydroxycyclohexyl phenylketone, benzophenone), and Darocur (registered trademark) 1173 (2-hydroxy-2-methyl-1-phenyl-1-propane-1-one), all commercially available from BASF GmbH.

The dialkoxyacetophenone-based compound is preferably exemplified by Irgacure (registered trademark) 651 (2,2-dimethoxy-1,2-diphenylethane-1-one) commercially available from BASF GmbH.

The aminoacetophenone-based compound is preferably exemplified by Irgacure (registered trademark) 369 (2-benzyl-2-dimethylamino-1-(4-morpholinophenyl)butanon e-1), Irgacure (registered trademark) 379 (EG) (2-dimethylamino-2-(4-methylbenzyl)-1-(4-morpholin-4-yl phenyl)butane-1-one, and Irgacure (registered trademark) 907 (2-methyl-1-[4-methylthiophenyl]-2-morpholinopropane-1-one, all commercially available from BASF GmbH.

The acylphosphine oxide-based compound is preferably exemplified by Irgacure (registered trademark) 819 (bis(2,4,6-trimethylbenzoyl)phenylphosphine oxide, Irgacure (registered trademark) 1800 (bis(2,6-dimethoxybenzoyl)-2,4,4-trimethyl-pentylphosphine oxide, all commercially available from BASF GmbH, Lucirin TPO (2,4,6-trimethylbenzoyl-diphenylphosphine oxide), and Lucirin TPO-L (2,4,6-trimethylbenzoylphenylethoxyphosphine oxide), again all commercially available from BASF GmbH.

The oxime ester-based compound is preferably exemplified by Irgacure (registered trademark) OXE01 (1,2-octanedione, 1-[4-(phenylthio)phenyl]-2-(O-benzoyloxime), Irgacure (registered trademark) OXE02 (ethanone, 1-[9-ethyl-6-(2-methylbenzoyl)-9H-carbazole-3-yl]-1-(O-acetyloxime), all commercially available from BASF GmbH.

The cationic photo-polymerization initiator used in the present invention is preferably sulfonium salt compound, iodonium salt compound, or oxim sulfonate compound, which is exemplified by 4-methylphenyl-[4-(1-methylethyl)phenyliodonium tetrakis(pentafluorophenyl) borate (PI2074, from Rhodia), 4-methylphenyl-[4-(2-methylpropyl)phenyliodonium hexafluorophosphate (Irgacure 250, from BASF), Irgacure PAG103, 108, 121 and 203 (from BASF).

The photo-polymerization initiator used in the present invention need be appropriately selected depending on wavelength of a light source to be used, and is preferably a product which does not emit gas during pressurizing under the mold and light exposure. Since the emitted gas will contaminate the mold, so that the mold need be cleaned up frequently, or the photo-curable composition will deform in the mold, to thereby degrade the accuracy of transferred pattern.

The curable composition for imprint of the present invention is preferably configured as a radical polymerizable curable composition, in which the (A) polymerizable compound is a radical polymerizable compound, and the (B) photo-polymerization initiator is a radical polymerization initiator capable of producing a radical upon being irradiated with light.

(C1) at Least One Species of Surfactant Containing 20% by Mass or More of Fluorine Atom The curable composition for imprint of the present invention contains at least one species of surfactant containing 20% by mass or more of fluorine atom. The ratio of fluorine atom is calculated by the equation below:

$$\text{Fluorine content} = \frac{(\text{Number of fluorine atoms in compound}) \times (\text{Atomic weight of fluorine atom})}{\text{Molecular weight of compound}} \times 100$$

The fluorine content in the curable composition containing two or more species of surfactants (C1) is determined as a sum of products obtained by multiplying the fluorine contents and mass concentration values of the individual surfactants in the total surfactants (C1).

The surfactant (C1) preferably contains 25% by mass or more of fluorine atom, and more preferably 28% by mass or more. While not specifically limited, the upper limit value is typically 80% by mass or less, and preferably 70% by mass or less.

The smaller the silicon content of the surfactant (C1), the better, wherein the silicon content is preferably 20% by mass or less, and more preferably the content is substantially zero. By reducing the content of silicon atom, the cured film will have the surficial portion which is etchable at a rate close to the etchrate of the inner portion, and thereby the cured film will have a uniform distribution of the etchrate over the depthwise direction thereof.

The surfactant (C1) used in the present invention is preferably a compound having a fluorine atom-containing alkyl group, fluorine atom-containing cycloalkyl group or fluorine atom-containing aryl group.

The fluorine atom-containing alkyl group is a straight-chain or branched-chain alkyl group having at least one hydrogen atom substituted by fluorine atom(s). The alkyl group preferably has 1 to 10 carbon atoms, and more preferably has 1 to 4 carbon atoms. The fluorine atom-containing alkyl group may have an additional substituent other than fluorine atom.

The fluorine atom-containing cycloalkyl group is a monocyclic or polycyclic cycloalkyl group having at least one hydrogen atom substituted by fluorine atom(s). The fluorine atom-containing cycloalkyl group may have an additional substituent other than fluorine atom.

The fluorine atom-containing aryl group is an aryl group having at least one hydrogen atom substituted by fluorine atom(s). The aryl group is exemplified by phenyl group and naphthyl group. The fluorine atom-containing aryl group may have an additional substituent other than fluorine atom.

By virtue of such structure, the surfactant is supposed to be improved in the eccentrically-locating ability over the surface, and suppressed from causing phase separation since it is partially solubilized with the polymer (C2).

The surfactant used in the present invention preferably has a molecular weight of 300 to 10,000, and more preferably 500 to 5,000.

The content of the surfactant (C1) used in the present invention is typically 0.01 to 10% by mass in the whole composition excluding the solvent, more preferably 0.1 to 7% by mass, and furthermore preferably 0.5 to 4% by mass. When two or more species of surfactants (C1) are used, the total amount falls in the ranges described above.

Examples of the surfactant (C1) usable in the present invention include Fluorad FC-430 and FC-431 (trade names, from Sumitomo 3M Ltd.), Surflon S-382 (trade name, from Asahi Glass Co., Ltd.), EFTOPEF-122A, 122B, 122C, EF-121, EF-126, EF-127 and MF-100 (from Tohkem Products Corporation), PF-636, PF-6320, PF-656 and PF-6520 (trade names, all from OMNOVA Solutions, Inc.), Ftergent FT250, FT251 and DFX18 (trade names, all from NEOS Co., Ltd.), Unidyne DS-401, DS-403 and DS-451 (trade names, all from Daikin Industries Ltd.), and Megafac 171, 172, 173, 178K, 178A and F780F (trade names, all from DIC Corporation).

Examples of the nonionic Si-containing surfactant include SI-10 Series (trade name, from Takemoto Oil & Fat Co., Ltd.), Megafac (from DIC Corporation), and KP-341 (from Shin-Etsu Chemical Co., Ltd.).

Examples of the fluorine and silicon-containing surfactant include X-70-090, X-70-091, X-70-092 and X-70-093 (trade names, all from Shin-Etsu Chemical Co., Ltd.), and Megafac R-08 and XRB-4 (trade names, all from DIC Corporation).

At Least One Species of Polymer (C2) Containing 3% by Mass or More and Less Than 20% by Mass of Fluorine Atom and/or 5% by Mass or More and Less Than 40% by Mass of Silicon Atom, and Having Weight-Average Molecular Weight (Mw) of 1,000 to 100,000.

The curable composition for imprint of the present invention contains at least one species of polymer which contains 3% by mass or more and less than 20% by mass of fluorine atom and/or 5% by mass or more and less than 40% by mass of silicon atom, and has a weight-average molecular weight (Mw) of 1,000 to 100,000. With this structure, the polymer is supposed to partially solubilize with the surfactant (C1) to thereby suppress the phase separation.

The ratio of silicon atom in the polymer is calculated in the same way using the equation regarding fluorine atom.

The polymer (C2) preferably contains 5 to 18% by mass, and more preferably 7 to 15% by mass, of fluorine atom. The (C2) polymer preferably contains 8 to 30% by mass, and more preferably 10 to 20% by mass, of silicon atom.

The polymer (C2) preferably has a weight-average molecular weight of 3,000 to 80,000, and more preferably 5,000 to 50,000.

The polymer (C2) preferably contains 3% by mass or more and less than 20% by mass of at least fluorine atom.

The polymer (C2) is generally synthesized by polymerizing a monomer having a polymerizable moiety typically through radical polymerization, and has a repeating unit derived from such monomer having a polymerizable moiety. The polymerizable moiety is exemplified by ethylenic polymerizable moiety.

The fluorine atom and/or silicon atom may be contained in the principal chain of the resin, or in the side chain.

The polymer (C2), when configured to contain fluorine atom, is preferably a compound having a fluorine atom-containing alkyl group, fluorine atom-containing cycloalkyl group, or fluorine atom-containing aryl group.

Fluorine atom or chlorine atom in the polymer (C2) may be contained in the principal chain of the resin, or may be contained by substitution in the side chain.

The polymer (C2) is preferably a resin having, as the fluorine atom-containing moiety, a fluorine atom-containing alkyl group, fluorine atom-containing cycloalkyl group, or fluorine atom-containing aryl group.

The fluorine atom-containing alkyl group (preferably having 1 to 10 carbon atoms, and more preferably 1 to 4 carbon atoms) is a straight-chain or branched alkyl group having at least one hydrogen atom substituted by fluorine atom(s), and may additionally have other substituent(s).

The fluorine atom-containing cycloalkyl group is a monocyclic or polycyclic cycloalkyl group having at least one hydrogen atom substituted by fluorine atom(s), and may additionally have other substituent(s).

The fluorine atom-containing aryl group is exemplified by those having at least one hydrogen atom in an aryl group, such as phenyl group and naphthyl group, with fluorine atom(s), and may additionally have other substituent(s).

The fluorine atom-containing alkyl group, fluorine atom-containing cycloalkyl group, or, fluorine atom-containing aryl group are preferably exemplified by groups represented by the formulae (F2) to (F4) below, without limiting the present invention.

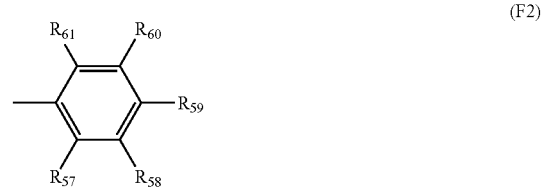

(F2)

(F3)

(F4)

In the formulae (F2) to (F4), each of $R_{57}$ to $R_{68}$ independently represents a hydrogen atom, fluorine atom or alkyl group. At least one of $R_{57}$ to $R_{61}$, $R_{62}$ to $R_{64}$ and $R_{65}$ to $R_{68}$ represents a fluorine atom, or an alkyl group (preferably having 1 to 4 carbon atoms) having at least one hydrogen atom substituted by fluorine atom(s). All of $R_{57}$ to $R_{61}$ and $R_{65}$ to $R_{67}$ are preferably fluorine atoms. $R_{62}$, $R_{63}$ and $R_{68}$ preferably represents an alkyl group (preferably having 1 to 4 carbon atoms) having at least one hydrogen atom substituted by fluorine atom(s), and more preferably a $C_{1-4}$ perfluoroalkyl group. $R_{62}$ and $R_{63}$ may couple to each other to form a ring.

The group represented by the formula (F2) is specifically exemplified by p-fluorophenyl group, pentafluorophenyl group, and 3,5-di(trifluoromethyl)phenyl group.

The group represented by the formula (F3) is specifically exemplified by trifluoromethyl group, pentafluoropropyl group, pentafluoroethyl group, heptafluorobutyl group, hexafluoroisopropyl group, heptafluoroisopropyl group, hexafluoro(2-methyl)isopropyl group, nonafluorobutyl group, octafluoroisobutyl group, nonafluorohexyl group, nonafluoro-t-butyl group, perfluoroisopentyl group, perfluorooctyl group, perfluoro(trimethyl)hexyl group, 2,2,3,3-tetrafluorocyclobutyl group, and perfluorocyclohexyl group. Preferable are hexafluoroisopropyl group, heptafluoroisopropyl group, hexafluoro(2-methyl)isopropyl group, octafluoroisobutyl group, nonafluoro-t-butyl group, and perfluoroisopentyl group, and more preferable are hexafluoroisopropyl group, and heptafluoroisopropyl group.

The group represented by the formula (F4) is specifically exemplified by —C(CF$_3$)$_2$OH, —C(C$_2$F$_5$)$_2$OH, —C(CF$_3$)(CH$_3$)OH, and —CH(CF$_3$)OH, wherein —C(CF$_3$)$_2$OH is preferable.

Specific examples of the fluorine atom-containing repeating unit will be shown below, without limiting the present invention.

In the specific examples, $X^1$ represents a hydrogen atom, —CH$_3$, —F or —CF$_3$. $X_2$ represents —F or —CF$_3$.

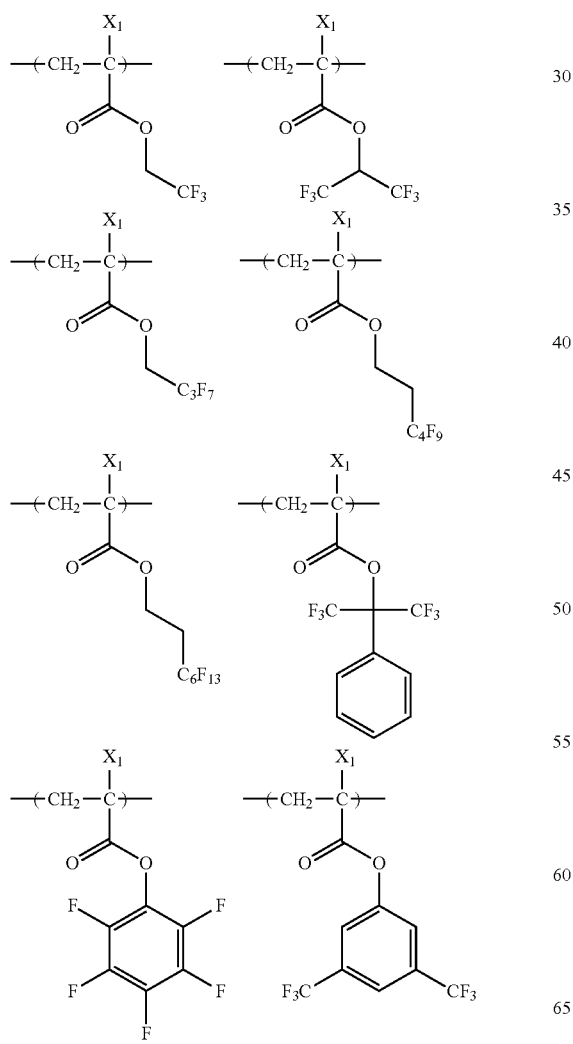

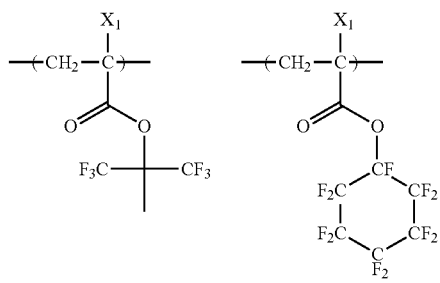

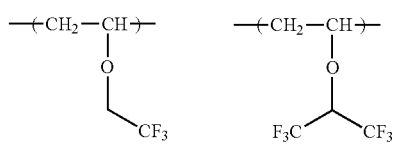

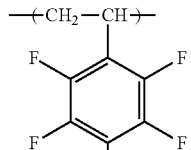

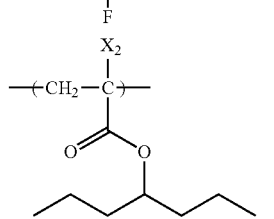

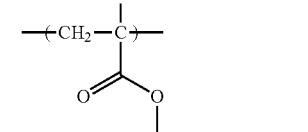

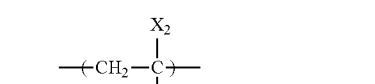

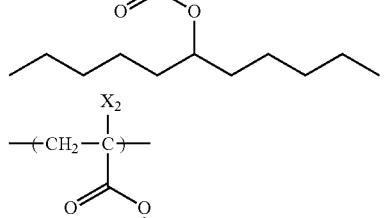

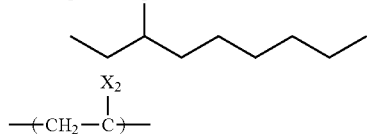

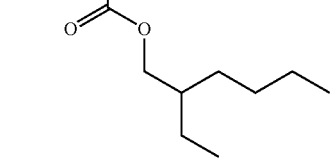

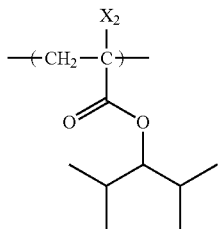

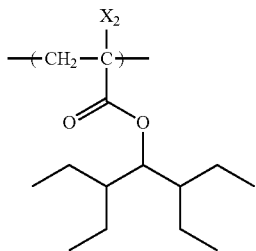

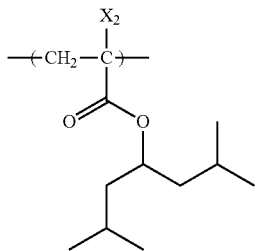

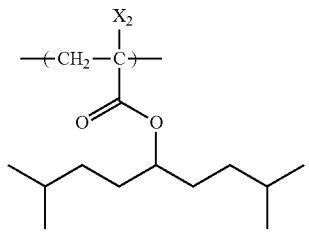

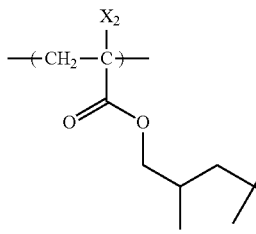

The polymer (C2), when configured to contain silicon atom, preferably has an alkylsilyl structure or cyclic siloxane structure, as the silicon atom-containing moiety. The alkylsilyl structure is preferably a structure containing a trialkylsilyl group.

The silicon atom-containing moiety is preferably a resin having an alkysilyl structure (preferably trialkylsilyl group), or a cyclic siloxane structure.

The alkylsilyl structure and cyclic siloxane structure are specifically exemplified by the groups represented by the formulae (CS-1) to (CS-3) below.

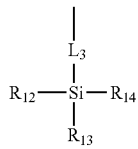
(CS-1)

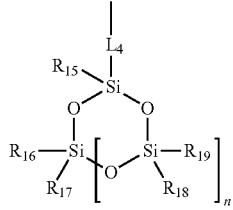
(CS-2)

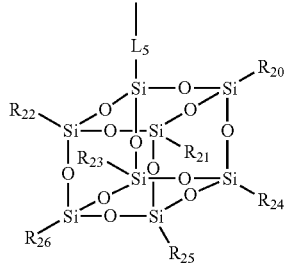
(CS-3)

In the formulae (CS-1) to (CS-3), each of $R_{12}$ to $R_{26}$ independently represents a straight-chain or branched alkyl group (preferably having 1 to 20 carbon atoms) or cycloalkyl group (preferably having 3 to 20 carbon atoms).

Each of $L_3$ to $L_5$ represents a single bond or divalent linking group. The divalent linking group is exemplified by a single species selected from the group consisting of alkylene group, phenylene group, ether group, thio ether group, carbonyl group, ester group, amide group, urethane group and urea group, and combinations of two or more species of them.

n represents an integer of 1 to 5. n preferably represents an integer of 2 to 4.

Specific examples of the repeating units represented by the formulae (CS-1) to (CS-3) will be shown below, without limiting the present invention. In the specific examples, $X^1$ represents a hydrogen atom, —$CH_3$, —F or —$CF_3$.

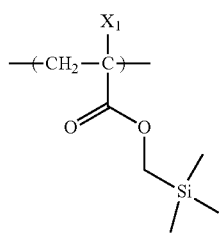 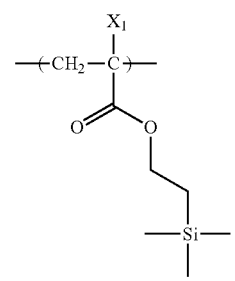

37
-continued

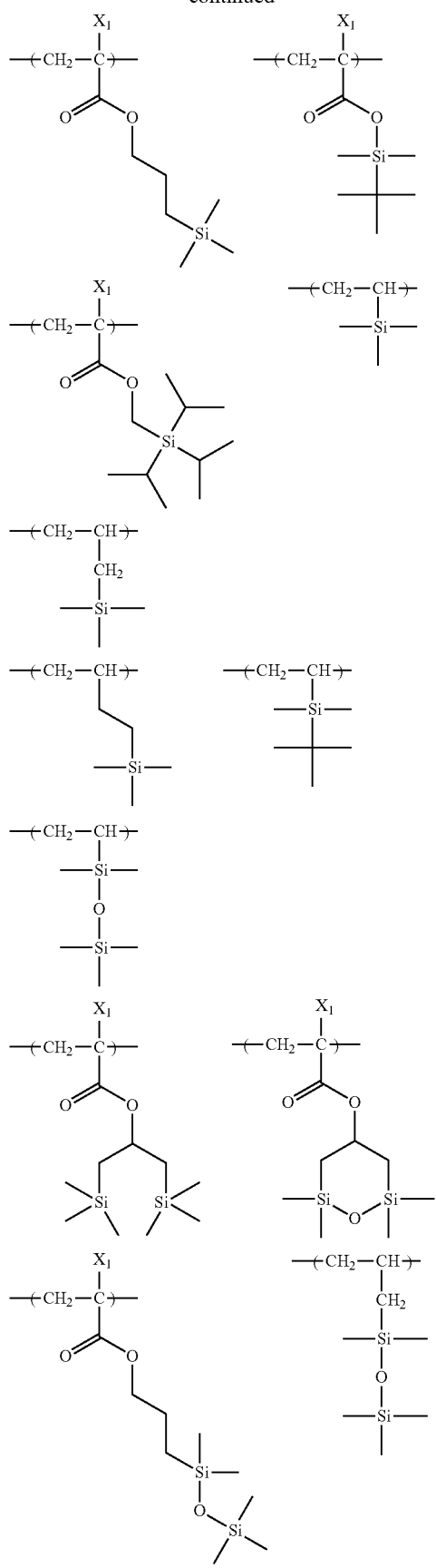

38
-continued

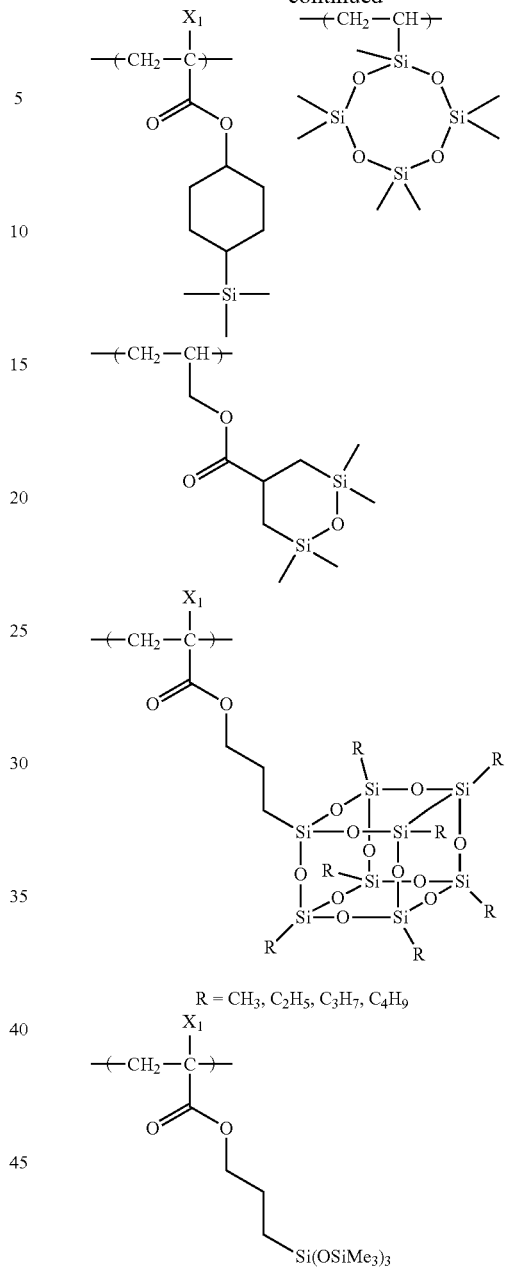

R = CH$_3$, C$_2$H$_5$, C$_3$H$_7$, C$_4$H$_9$

The polymer (C2) may additionally have a repeating unit represented by the formula (III) below:

$$\left(\begin{array}{c}H_2\\C\end{array}-\begin{array}{c}R_{c31}\\|\\C\\|\\L_{c3}\\|\\R_{c32}\end{array}\right) \quad \text{(III)}$$

In the formula (III), $R_{c31}$ represents a hydrogen atom, alkyl group, alkyl group which may be substituted by fluorine atom, cyano group or —CH$_2$—O-Rac$_2$ group. In the formula, Rac$_2$ represents a hydrogen atom, alkyl group or acyl group.

$R_{c31}$ preferably represents a hydrogen atom, methyl group, hydroxymethyl group, or trifluoromethyl group, and particularly a hydrogen atom or methyl group.

$R_{c32}$ represents an alkyl group, cycloalkyl group, alkenyl group, or cycloalkenyl group. Each of these groups may be substituted by fluorine atom, and/or silicon atom.

$L_{c3}$ represents a single bond or divalent linking group.

The alkyl group represented by $R_{c32}$ in the formula (III) is preferably a $C_{3-20}$ straight-chain or branched alkyl group.

The cycloalkyl group is preferably a $C_{3-20}$ cycloalkyl group.

The alkenyl group is preferably a $C_{3-20}$ alkenyl group.

The cycloalkenyl group is preferably a $C_{3-20}$ cycloalkenyl group.

$R_{c32}$ is preferably an unsubstituted alkyl group, or an alkyl group substituted by fluorine atom(s).

The divalent linking group represented by $L_{c3}$ is preferably an ester group, alkylene group (preferably having 1 to 5 carbon atoms), oxy group, phenylene group, or ester bond (group represented by —COO—).

The polymer (C2) also preferably has a repeating unit represented by the formula (CII-AB) below:

(CII-AB)

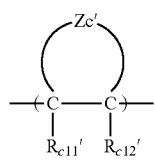

In the formula (CII-AB), each of $R_{c11}'$ and $R_{c12}'$ independently represents a hydrogen atom, cyano group, halogen atom or alkyl group.

Zc' represents an atomic group which contains two linked carbon atoms (C—C), used to configure an alicyclic structure.

Specific examples of the repeating unit represented by the formulae (III) and (CII-AB) will be shown below, without limiting the present invention. In the formula, Ra represents a H, $CH_3$, $CH_2OH$, $CF_3$ or CN.

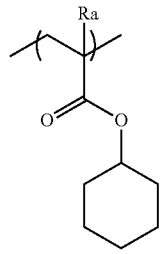
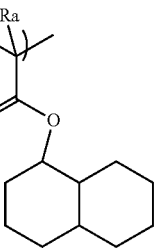
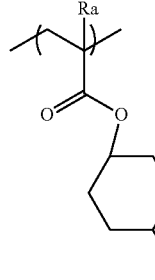
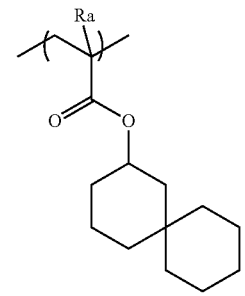

-continued

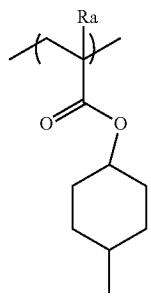
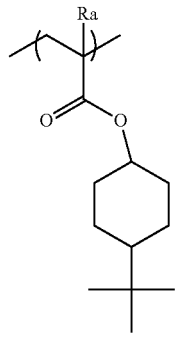
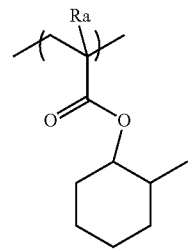
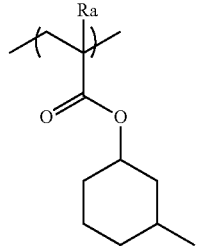
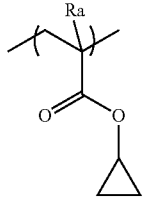
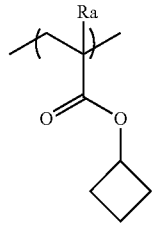
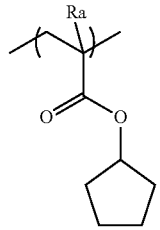
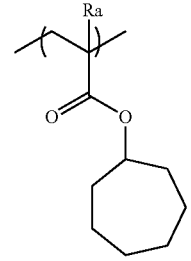

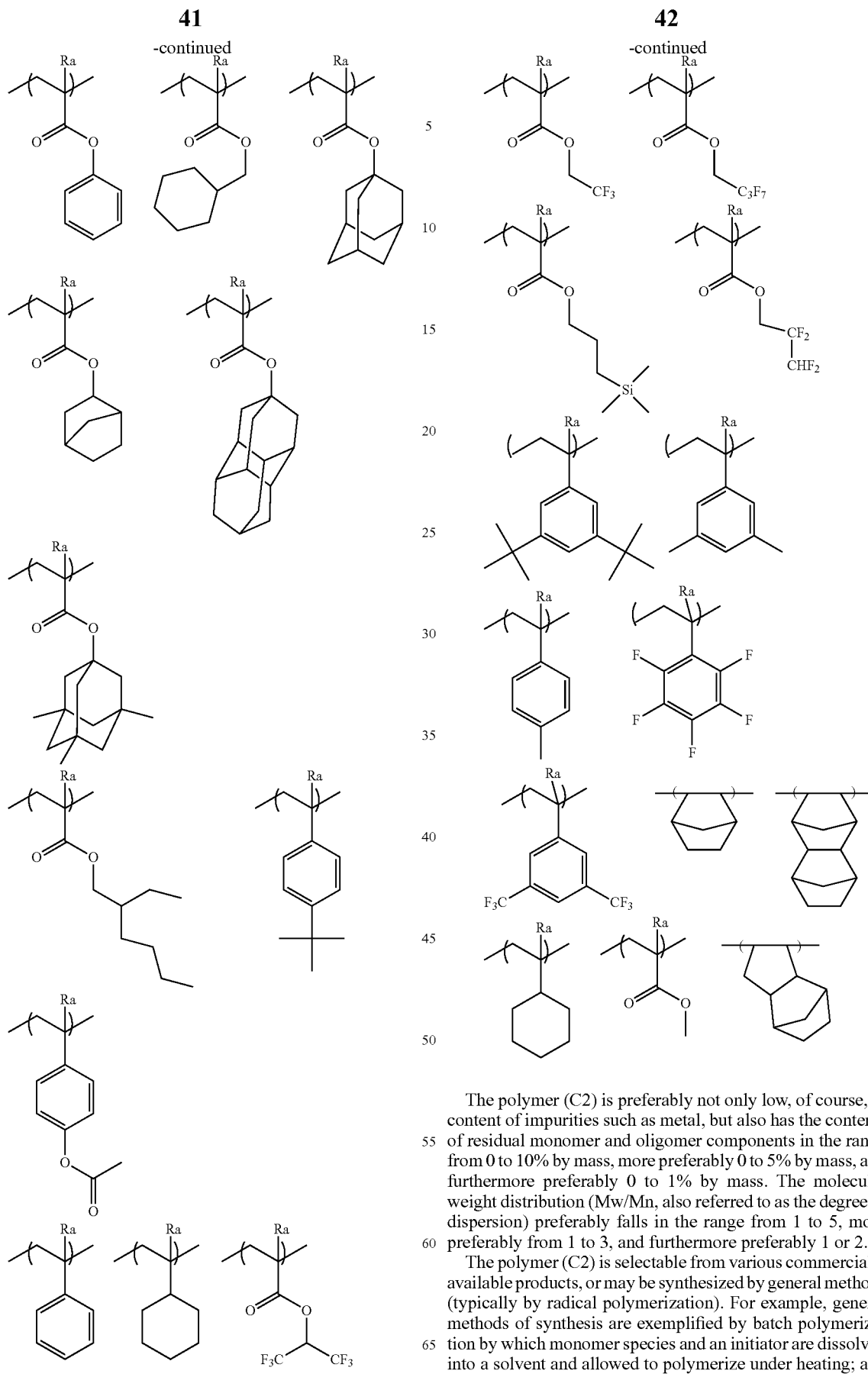

The polymer (C2) is preferably not only low, of course, in content of impurities such as metal, but also has the contents of residual monomer and oligomer components in the range from 0 to 10% by mass, more preferably 0 to 5% by mass, and furthermore preferably 0 to 1% by mass. The molecular weight distribution (Mw/Mn, also referred to as the degree of dispersion) preferably falls in the range from 1 to 5, more preferably from 1 to 3, and furthermore preferably 1 or 2.

The polymer (C2) is selectable from various commercially available products, or may be synthesized by general methods (typically by radical polymerization). For example, general methods of synthesis are exemplified by batch polymerization by which monomer species and an initiator are dissolved into a solvent and allowed to polymerize under heating; and drop polymerization by which solutions of monomer species and an initiator are added into a heated solvent over 1 to 10 hours. The drop polymerization is preferable. The reaction solvent is exemplified by ethers such as tetrahydrofuran, 1,4-dioxane, and diisopropyl ether; ketones such as methyl ethyl ketone, and methyl isobutyl ketone; ester solvents such as ethyl acetate; amide solvents such as dimethylformamide, and dimethylacetamide; and other solvents such as propylene glycol monomethyl ether acetate, propylene glycol monomethyl ether, and cyclohexanone which are capable of dissolving therein the composition of the present invention.

The polymerization reaction is preferably allowed to proceed under an inert gas environment typically using nitrogen or argon. A commercially available radical initiator (azo-based initiator, peroxide, etc.) is used as the polymerization initiator, to initiate the polymerization. The radical initiator is preferably an azo-based initiator which preferably has an ester group, cyano group, or carboxy group. Preferable examples of the initiator include azobisisobutyronitrile, azobisdimethylvaleronitrile, and dimethyl-2,2'-azobis(2-methylpropionate). Reaction concentration is 5 to 50% by mass, and preferably 30 to 50% by mass. Reaction temperature is generally 10° C. to 150° C., preferably 30° C. to 120° C., and furthermore preferably 60 to 100° C.

Upon completion of the reaction, the reaction mixture is allowed to cool down to room temperature, and purified. The purification may be conducted by any of general methods which include solution-state purification such as liquid-liquid extraction by which residual monomer and oligomer components are removed by washing with water, optionally combined with appropriate solvent, and ultra-filtration by which only components with molecular weights smaller than a predetermined value are selectively extracted and removed; and solid-state purification such as re-precipitation in which the resin solution is dropped into a poor solvent so as to be solidified therein, to thereby remove the residual monomer and so forth, and washing of the filtered resin slurry with a poor solvent. For example, the reaction solution is brought into contact with 10 times or less in volume, preferably 10 to 5 times in volume of a solvent (poor solvent) in which the resin is poorly soluble or insoluble, so as to allow the resin to deposit in the solid form.

The solvent used in the process of precipitation from the polymer solution or in the operation of reprecipitation (solvent of precipitation or reprecipitation) is arbitrary so long as it is a poor solvent of the polymer, and is appropriately selectable from hydrocarbon, halogenated hydrocarbon, nitro compound, ether, ketone, ester, carbonate, alcohol, carboxylic acid, water, and mixed solvents containing any of these solvents, depending on species of the polymer. Among them, solvent containing at least alcohol (particularly methanol, etc.) or water is preferable as the solvents for precipitation or reprecipitation.

The amount of use of the solvents for precipitation or reprecipitation is arbitrarily selectable taking efficiency, yield and so forth into consideration, and is generally 100 to 10,000 parts by mass per 100 parts by mass of polymer solution, preferably 200 to 2,000 parts by mass, and furthermore preferably 300 to 1,000 parts by mass.

Temperature of precipitation or reprecipitation is arbitrarily selectable taking efficiency and operability into consideration, and is generally 0 to 50° C. or around, and preferably at around room temperature (20 to 35° C. or around, for example). The precipitation or reprecipitation may be conducted according to any of publicly known methods including batch process, continuous process and so forth, using a general mixing vessel such as mixing tank.

Precipitated or reprecipitated polymer is generally subjected to a common process of solid-liquid separation such as filtration, centrifugation or the like, and used after dried. The filtration is conducted using a solvent-resistant filter material, preferably under pressure. The drying is conducted under normal pressure or reduced pressure (preferably under reduced pressure), at 30 to 100° C. or around, and preferably 30 to 50° C. or around.

It is also preferable to once allow the resin to deposit, separate the resin, dissolve the resin again into a solvent, and bring the resin into contact with a solvent which hardly or does not dissolve the resin. More specifically, one possible method is such that, after completion of the radical polymerization reaction, the reaction mixture is brought into contact with a solvent which hardly or does not dissolve the resin so as to allow the resin to deposit (step a), the resin is separated from the solution (step b), again dissolved into a solvent to thereby prepare a resin solution A (step c), and then the resin solution A is brought into contact with less than ten times in volume (preferably 5 times or less in volume) of a solvent which hardly or does not dissolve the resin to thereby allow a solid-state resin to deposit (step d), and the deposited resin is separated (step e).

Specific examples of the polymer (C2) will be shown below. Table 1 below shows molar ratios of repeating units (notations are corresponded to the respective repeating units read from the left) in the individual resins, weight-average molecular weight, and degree of dispersion.

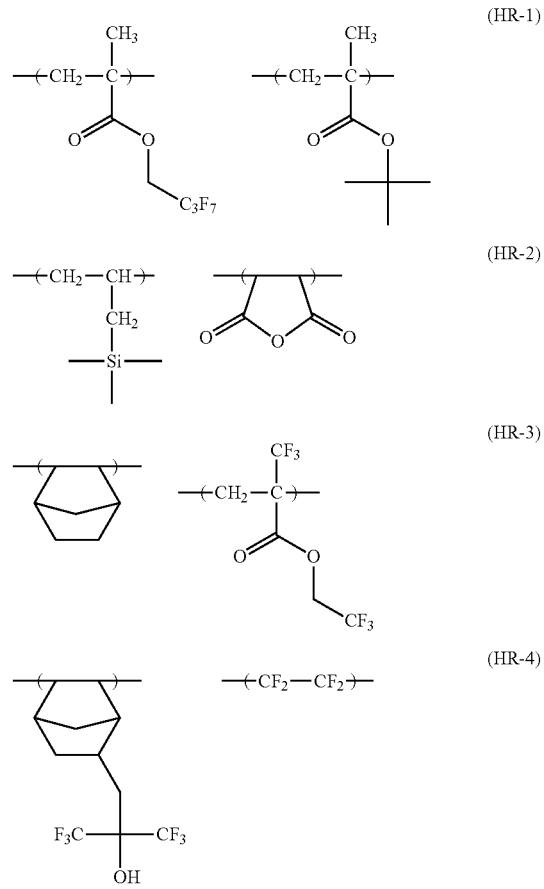

(HR-5)
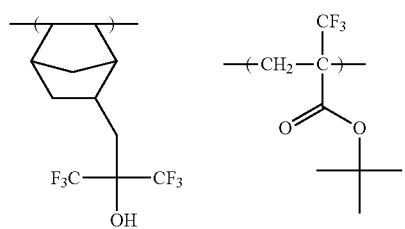
(HR-6)
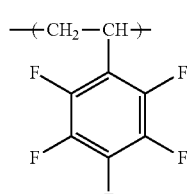
(HR-7)
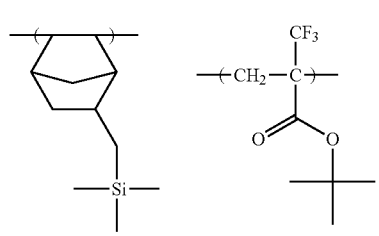
(HR-8)
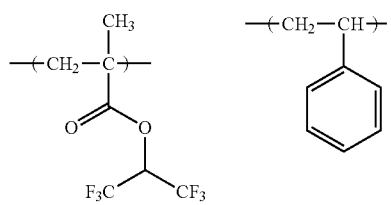
(HR-9)
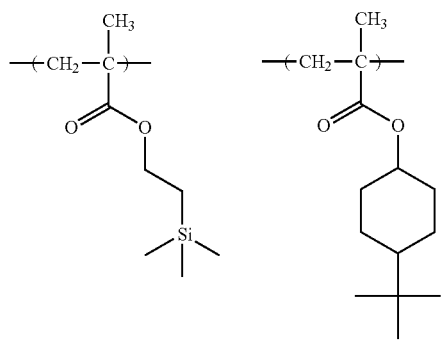
(HR-10)
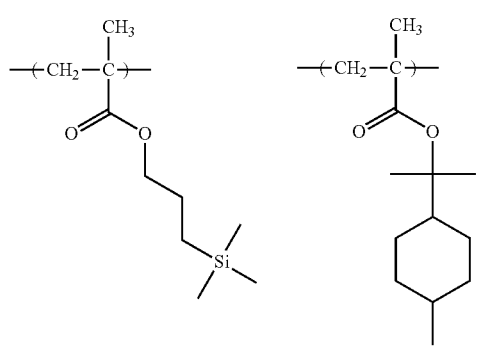
(HR-11)
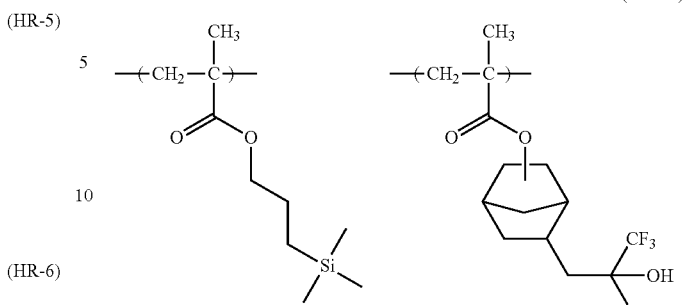
(HR-12)
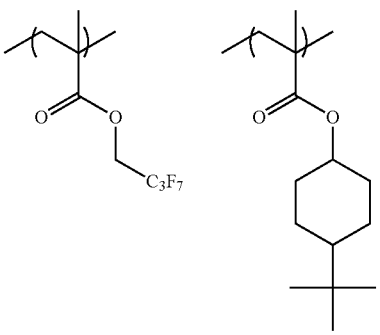
(HR-13)
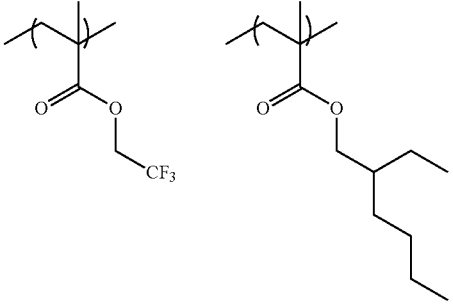
(HR-14)
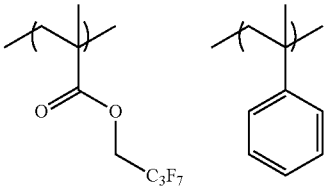
(HR-15)
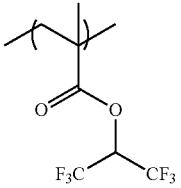
(HR-16)
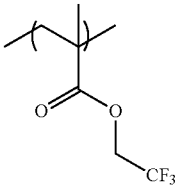

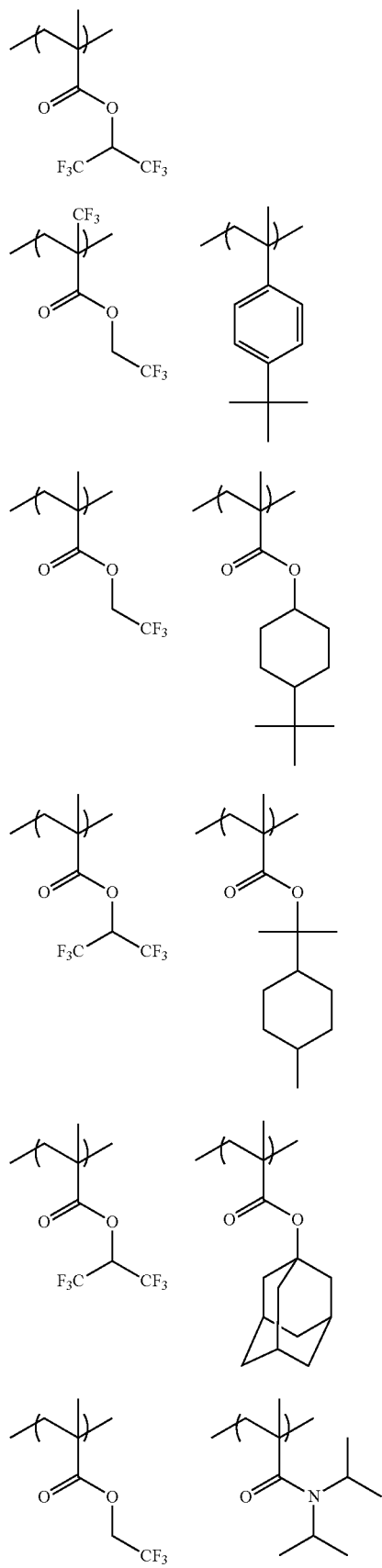
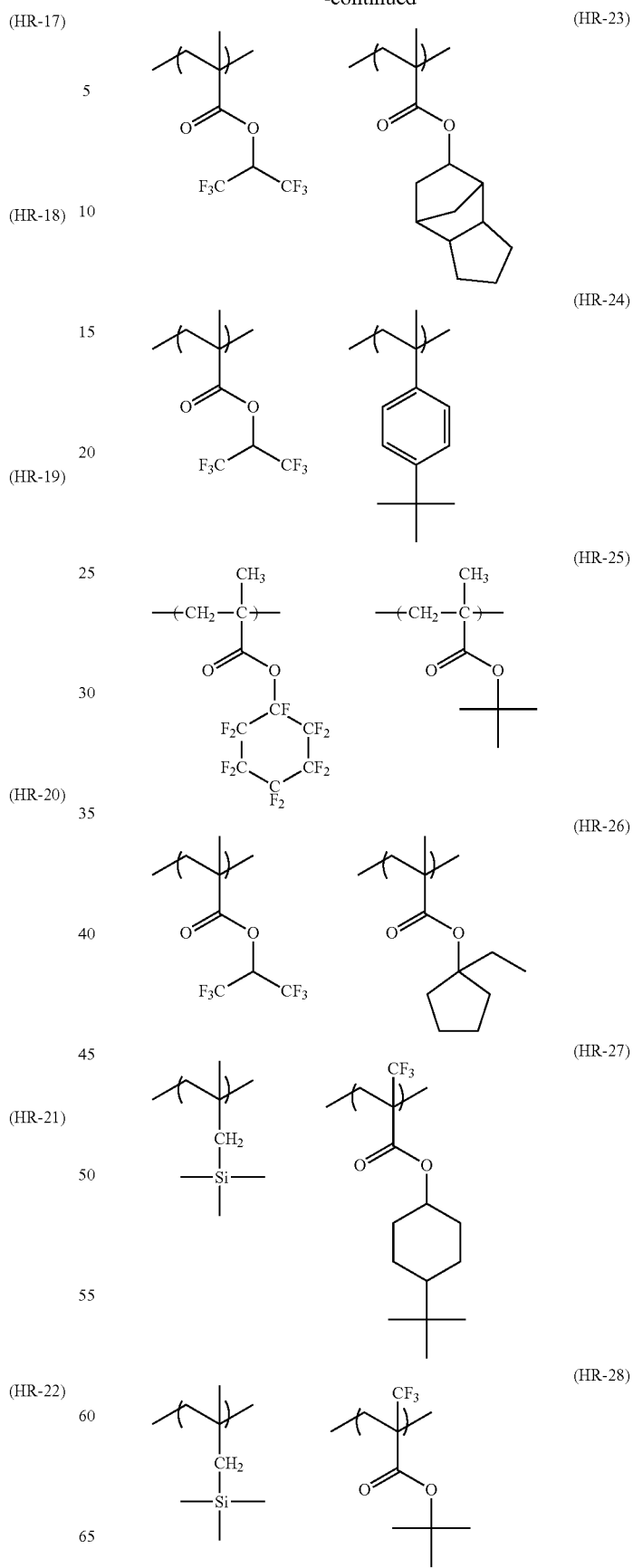

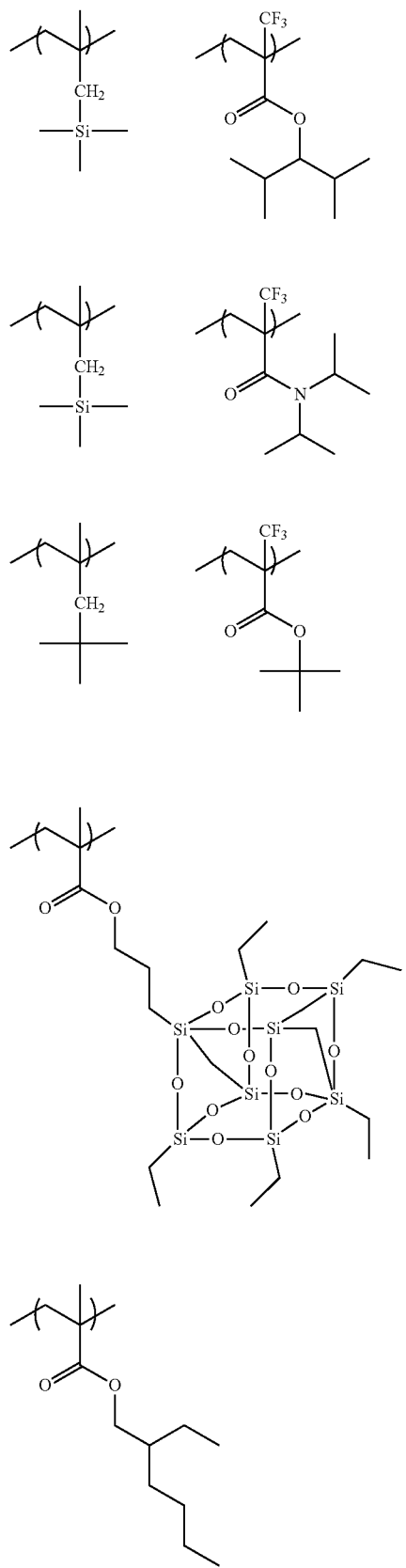
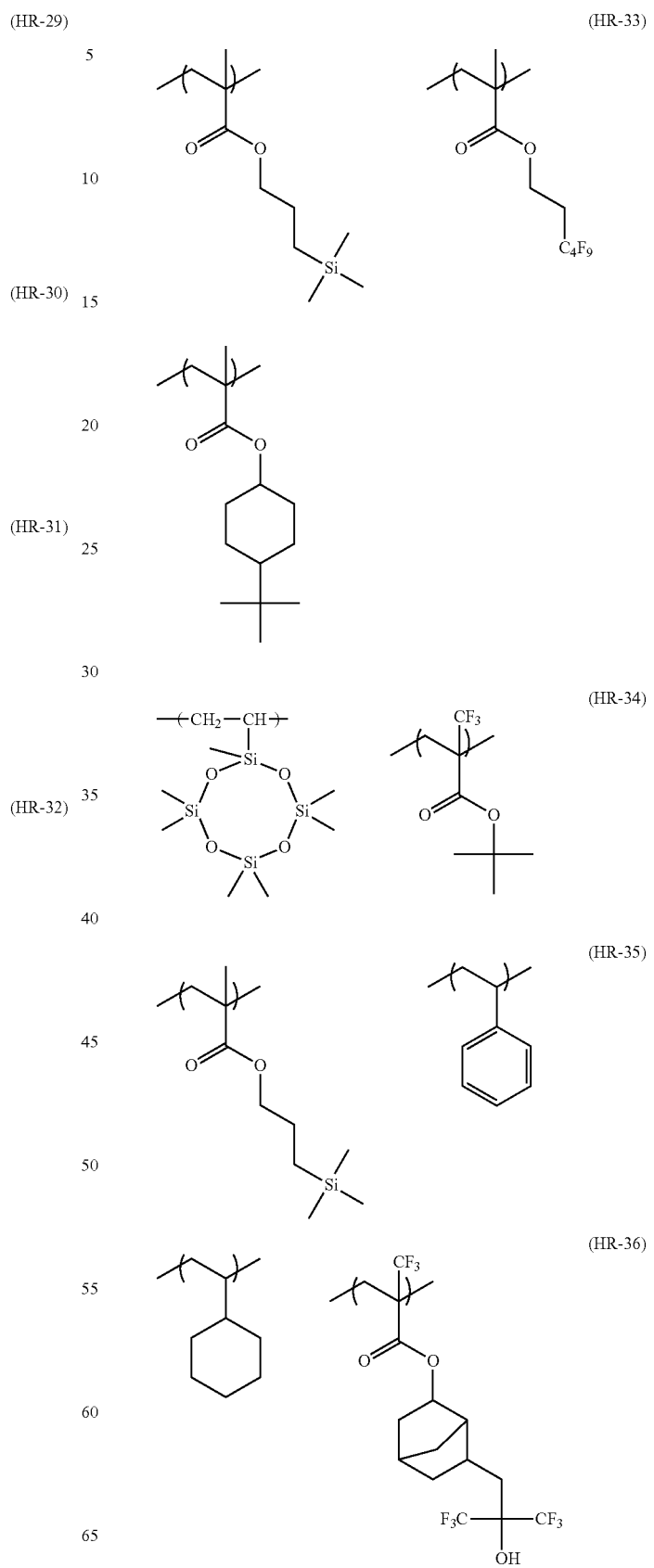

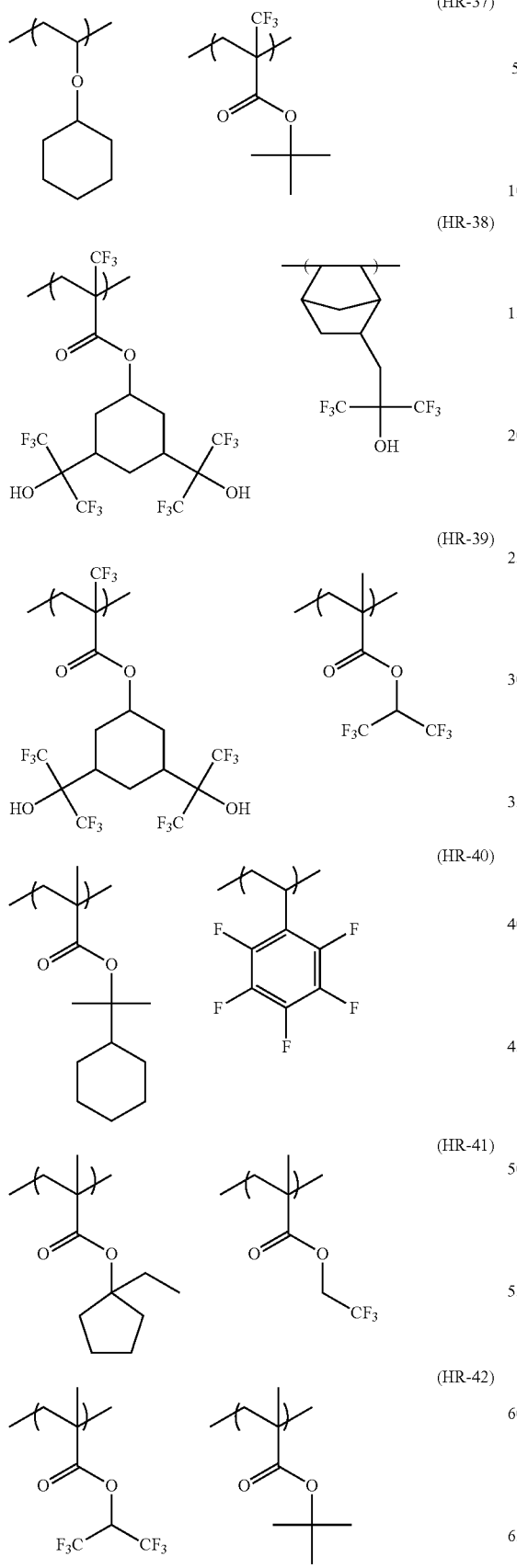
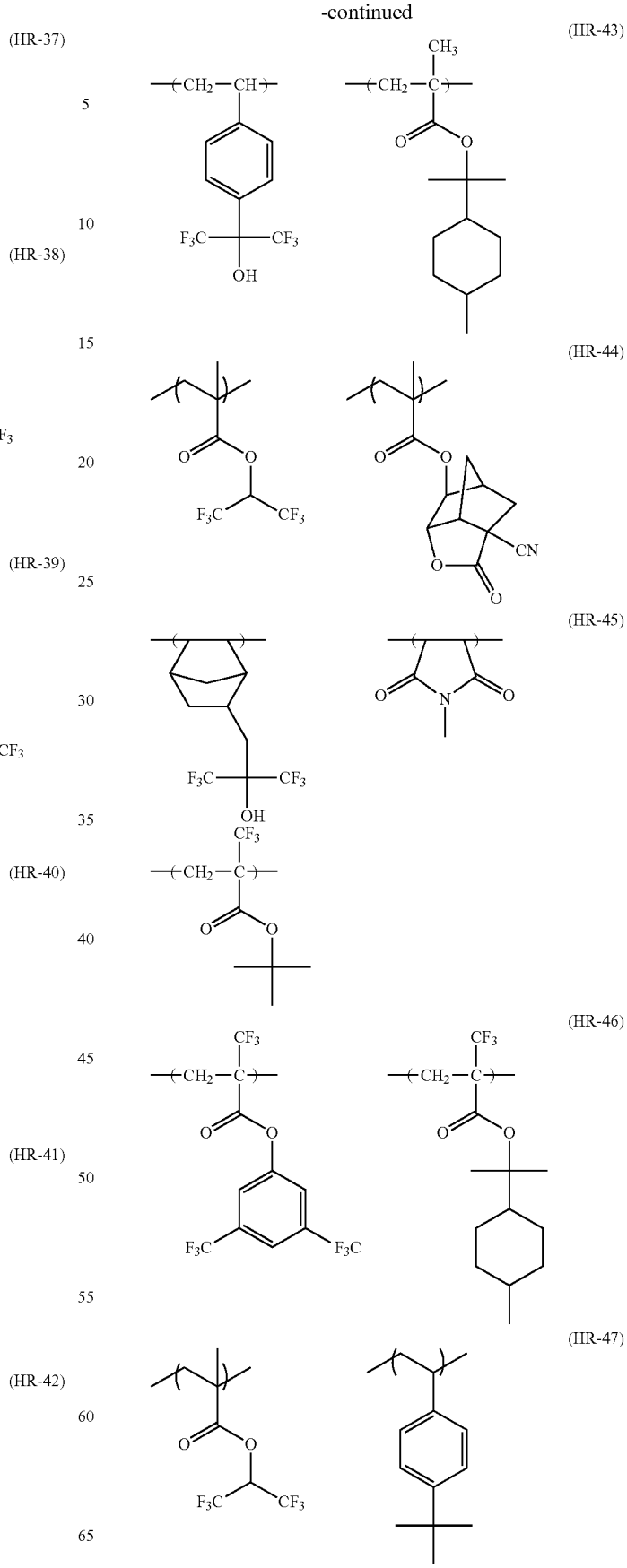

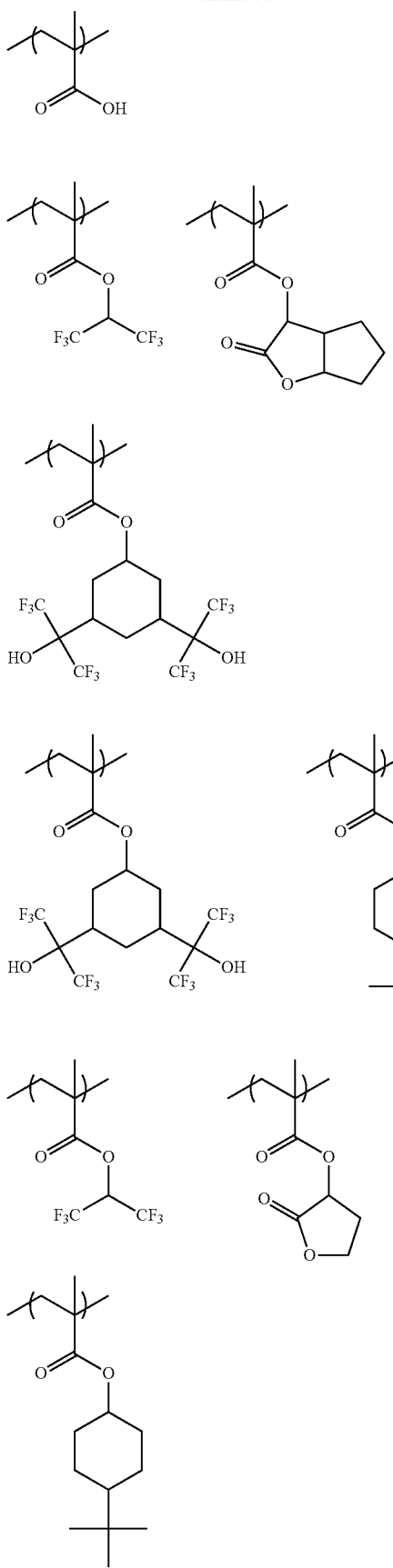
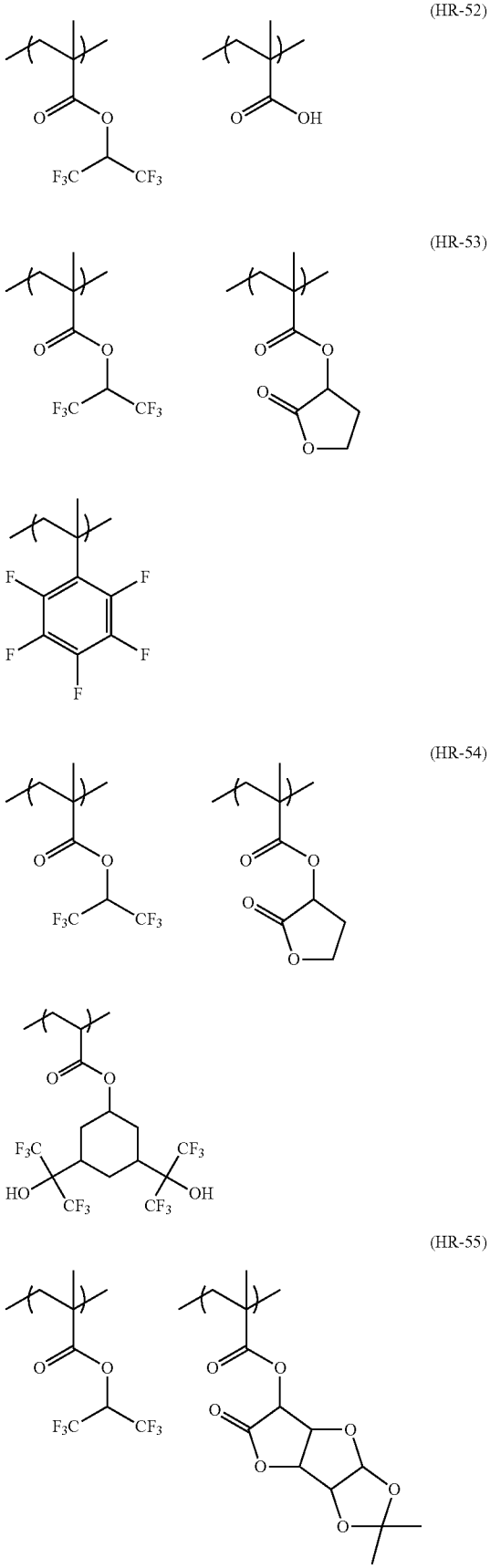

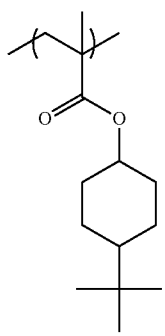
(HR-56)
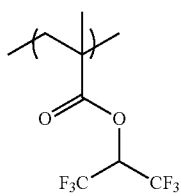
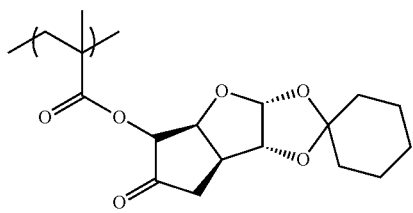
(HR-57)
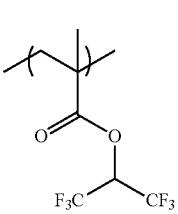
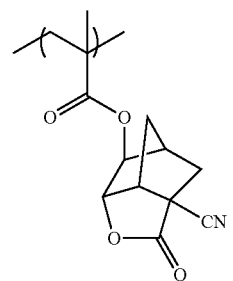
(HR-58)
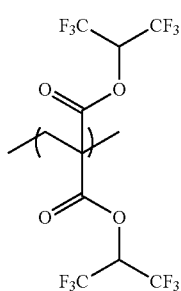
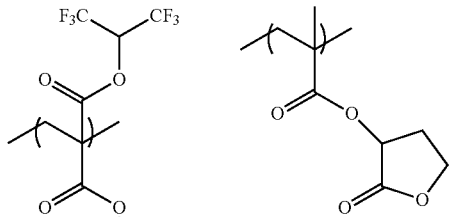
(HR-59)
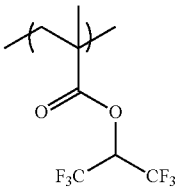
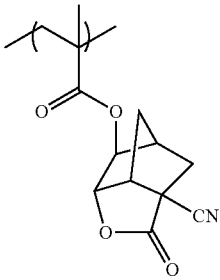
(HR-60)
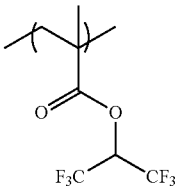
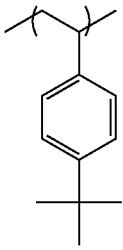
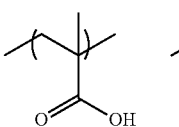
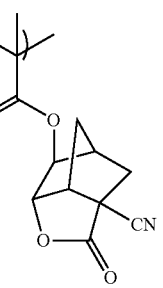
(HR-61)
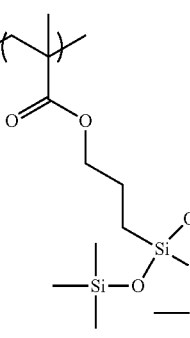
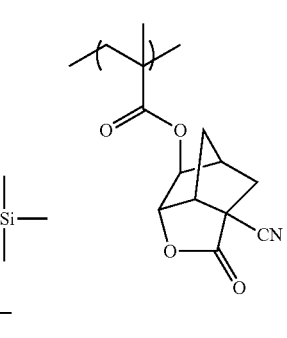
(HR-62)
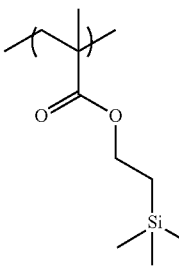
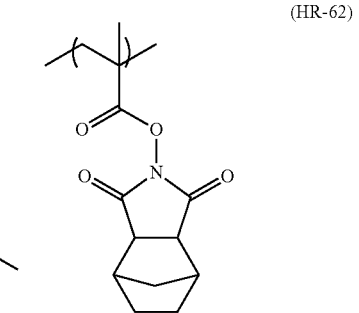

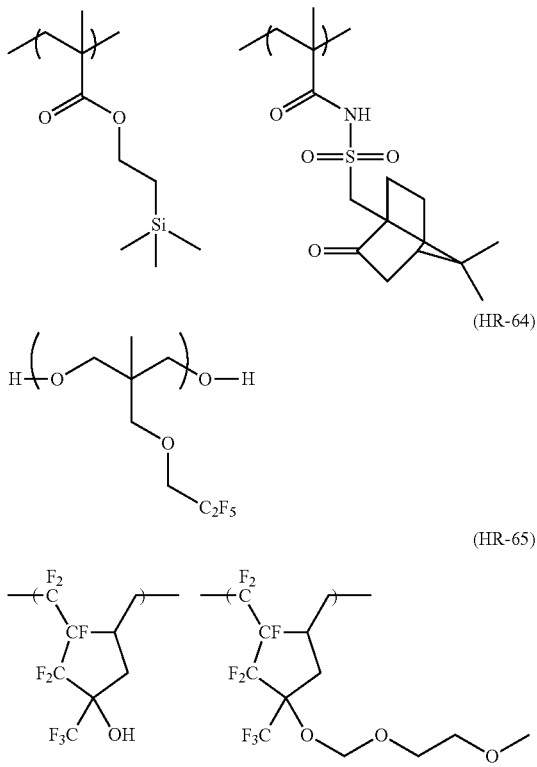

TABLE 1

| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-3 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

The content of the polymer (C2) used in the present invention is typically 0.01 to 10% by mass in the whole composition excluding the solvent, preferably 0.1 to 7% by mass, and furthermore preferably 0.5 to 4% by mass. When two or more species of polymer (C2) are used, the total amount falls in the ranges described above.

In the present invention, difference between the ratio of fluorine atom content (% by mass) of the compound (C1) and the total content of fluorine atom and silicon atom of the polymer (C2) is preferably 3 to 70%, and more preferably 10 to 60%. With the difference adjusted in these ranges, the effect of the present invention will tend to be developed in a more effective manner.

In the present invention, difference between the molecular weight of the compound (C1) and the weight-average molecular weight of polymer is preferably 1,000 to 50,000, and more preferably 3,000 to 40,000. With the difference adjusted in these ranges, the effect of the present invention will tend to be developed in a more effective manner.

In the pattern obtained by curing the curable composition for imprint of the present invention, when viewed in the thickness-wise direction of the pattern, the fluorine atom content in the 10% range from the substrate surface, the fluorine atom content in the 45 to 55% range from the substrate surface, and the fluorine atom content in the 90 to 100% range from the substrate surface, increase in this order.

The fluorine atom content in the surficial portion of the cured film is observable by ESCA, and the depth-wise fluorine atom content is observable by further combining it with etching.

(D) Solvent

The curable composition for imprint of the present invention may contain a solvent (D). The curable composition for imprint of the present invention will successfully be controlled in the viscosity, by containing the solvent.

The solvent (D) usable in the present invention is exemplified by ketones such as 2-butanone, 3-methylbutanone, pinacolone, 2-pentanone, 3-pentanone, 3-methyl-2-pentanone, acetone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, diisobutyl ketone, phenylacetone, methyl naphthyl ketone, acetylacetone, acetonyl acetone, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone isophorone; alkylene carbonates such as vinylene carbonate, ethylene carbonate, butyrene carbonate and propylene carbonate; esters such as methyl acetate, butyl acetate, ethyl acetate, isopropyl acetate, amyl acetate, propylene glycol monomethyl ether acetate, propylene glycol monoethyl ether acetate, propylene glycol monopropyl ether acetate, propylene glycol monobutyl ether acetate, ethylene glycol monoethyl ether acetate, ethylene glycol monomethyl ether acetate, diethylene glycol monobutyl ether acetate, diethylene glycol monoethyl ether acetate, 3-methoxybutyl acetate, 3-methyl-3-methoxybutyl acetate, propylene glycol monomethyl ether propionate, propylene glycol monoethyl ether propionate, methyl 3-methoxypropionate, methyl 3-ethoxypropionate, ethyl 3-methoxypropionate, ethyl 3-ethoxypropionate, methyl formate, ethyl formate, butyl formate, propyl formate, methyl lactate, ethyl lactate, propyl lactate, and butyl lactate; lactones such as β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone; alcohols such as methanol, ethanol, n-propanol, isopropanol, n-butanol, s-butanol, tert-butanol, isobutanol, n-hexanol, n-heptanol, n-octanol, n-decanol, 4-methyl-2-pentanol, ethylene glycol, diethylene glycol and triethylene glycol; ethers such as ethylene glycol monomethyl ether, propylene glycol monomethyl ether, ethylene glycol monoethyl ether, propylene glycol monoethyl ether, propylene glycol monopropyl ether, propylene glycol monobutyl ether, diethylene glycol monomethyl ether, dibutyl ether, diisopentyl ether, triethylene glycol monoethyl ether, methoxymethylbutanol, dioxane, tetrahydrofuran and anisole; amides such as N-methyl-2-pyrrolidone, N,N-dimethylacetamide, N,N-dimethylformamide, hexamethylphosphoric triamide and 1,3-dimethyl-2-imidazolidinone; aromatic hydrocarbons such as toluene and xylene; aliphatic hydrocarbons such as pentane, hexane, octane, decane, cyclopentane and cyclohexane; water, and mixtures of them.

In the curable composition for imprint of the present invention, the amount of addition of solvent may fall in the range of 99% by mass or less of the whole composition, the amount is generally 30% by mass or less, preferably 20% by mass or less, and particularly 10% by mass or less. It is, however, preferable that the curable composition for imprint of the present invention contains substantially no solvent. Substantially no solvent herein means that the content of liquid component, other than the (A) polymerizable monomer and the (B) polymerization initiator, is typically 3% by mass or less, and more specifically 1% by mass or less.

(Other Components)

The curable composition for imprint of the present invention may contain other components such as antioxidant depending on various needs, so long as they will not ruin the effect of the present invention.

—Antioxidant—

Preferably, the curable composition for imprints used in the invention contains a known antioxidant. The content of the antioxidant to be in the composition is, for example, from 0.01 to 10% by mass of the total amount of the polymerizable monomers constituting the composition, preferably from 0.2 to 5% by mass. When two or more different types of antioxidants are in the composition, the total amount thereof falls within the above range.

The antioxidant is for preventing fading by heat or photoirradiation, and for preventing fading by various gases such as ozone, active hydrogen NOx, SOx (x is an integer), etc. Especially in the invention, the antioxidant added to the composition brings about the advantage that the cured film is prevented from being discolored and the film thickness is prevented from being reduced through decomposition. The antioxidant includes hydrazides, hindered amine-type antioxidants, nitrogen-containing heterocyclic mercapto compounds, thioether-type antioxidants, hindered phenol-type antioxidants, ascorbic acids, zinc sulfate, thiocyanates, thiourea derivatives, saccharides, nitrites, sulfites, thiosulfates, hydroxylamine derivatives, etc. Of those, preferred are hindered phenol-type antioxidants and thioether-type antioxidants from the viewpoint of their effect of preventing cured film discoloration and preventing film thickness reduction.

Commercial products of the antioxidant usable herein include Irganox 1010, 1035, 1076, 1222 (all by BASF GmbH); Antigene P, 3C, FR, Sumilizer S, Sumilizer GA80 (by Sumitomo Chemical); Adekastab A070, A080, A0503 (by Adeka), etc. These may be used either singly or as combined.

—Polymerization Inhibitor—

Furthermore, the curable composition for imprints used in the invention preferably comprises a polymerization inhibitor. The content of the polymerization inhibitor is from 0.001 to 1% by mass, more preferably from 0.005 to 0.5% by mass, and even more preferably from 0.008 to 0.05% by mass, relative to all the polymerizable monomers, and the change in the viscosities over time can be inhibited while maintaining a high curing sensitivity by blending the polymerization inhibitor in an appropriate amount. The polymerization inhibitor may be added in the process of preparing the polymerizable monomer, or may be added later to the curable composition. Examples of preferable polymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylene bis(4-methyl-6-tert-butylphenol), N-nitrosophenylhydroxyamine serous salt, phenothiazine, phenoxazine, 4-methoxynaphthol, 2,2,6,6-tetramethylpiperidine-1-oxyl free radical, 2,2,6,6-tetramethylpiperidine, 4-hydroxy-2,2,6,6-tetramethylpiperidine-1-oxyl free radical, nitrobenzene, and dimethylaniline, and preferably p-benzoquinone, 2,2,6,6-tetramethylpiperidine-1-oxyl free radical, 4-hydroxy-2,2,6,6-tetramethylpiperidine-1-oxyl free radical, and phenothiazine. These polymerization inhibitors may suppress polymer impurities from generating, not only in the process of preparing the polymerizable monomer, but also during storage of the curable composition, to thereby suppress degradation in the pattern formability in imprinting.

The curable composition for imprint of the present invention may optionally be added with, besides the components described above, mold releasing agent, silane coupling agent, UV absorber, photo-stabilizer, anti-aging agent, plasticizer, adherence promoter, heat polymerization initiator, colorant, elastomer particle, photo acid amplifier, photo base generator, basic compound, fluidity modifier, defoaming agent, dispersion aid or the like.

The curable composition for imprint of the present invention is preferably allowed to pass through a filter after prepared. The filter used herein preferably has an effective filter area of 200 $cm^2$ or larger. The effective filter area of the filter is preferably 300 $cm^2$ or larger, more preferably 500 $cm^2$ or larger, and furthermore preferably 1,000 $cm^2$ or larger.

The effective filter area in the present invention means the area of a portion of the filter, out of the wetted part thereof, on which particles incapable of passing therethrough will deposit in the filtration process, and is generally the surface area of a barrier filter.

Although not specifically limited, preferable systems for allowing the curable composition for imprint to pass through the filter plural times are exemplified by a system of circulating the composition in a device equipped with a filter; a system of allowing the composition to pass once or more, through every one of a plurality of filters connected in series; a system of conducting filtration followed by another filtration through the same or different filters; and a system based on a combination of them.

In the system of allowing the composition to pass through the filters twice of more, every succeeding filter preferably has a pore size smaller than that of the preceding filter. With this configuration, lift-off of the pattern tends to be suppressed more effectively.

While the pressure to be applied during passage through the filter in the filtration process may vary depending on materials composing the filter and filtration device, chemical structure of the curable composition and so forth, it is preferably 0.5 MPa or below. With the pressure adjusted in this range, particles in association with impurities are more effectively prevented from passing through the filter.

The pressure to be applied is more preferably 0.05 MPa to 0.3 MPa, and furthermore preferably 0.05 MPa to 0.1 MPa.

In the present invention, the average flow rate of the curable composition for imprint is preferably 0.01 L/min or larger, and more preferably 0.05 L/min to 3.0 L/min.

Among the filters used in the present invention, at least one of them preferably has a pore size of 0.1 μm or smaller. It is more preferable that all filters have a pore size of 0.1 μm or smaller.

The pore size is more preferably 0.05 μm or smaller, and furthermore preferably 0.005 to 0.05 μm. By the passage through the filters with such pore sizes, submicron particles or foreign matters may be eliminated.

While filter materials used in the present invention are not specifically limited, at least one of them is preferably composed of polypropylene-based resin, fluorine-containing resin, polyethylene-based resin, nylon-based resin or the like. From the viewpoint of performance of eliminating foreign matters and temporal stability of the filter, it is particularly preferable that at least one of them is fluorine-containing resin-based filter or polyethylene-based filter.

At least one of the filters used in the present invention is preferably a filter cartridge composed of a pleated membrane filter. The filter cartridge composed of a pleated membrane filter is advantageous for its large effective area achieved in the manufacturing process.

The curable composition for imprint of the present invention is capable of forming a fine pattern by photo-nanoimprinting at low cost and high accuracy. Accordingly, the pattern having been formed by the conventional photolithographic technique, will now be formed with still higher accuracy and at lower cost. For example, by applying the composition of the present invention on a substrate or support, and by subjecting a layer composed of the composition to light exposure, curing and optional drying, the composition is now also adoptable to a permanent film such as overcoat layer, insulating film and so forth typically used for liquid crystal display device (LCD), or to an etching resist used for manufacturing semiconductor integrated circuit, recording medium, flat panel display device and so forth.

For the resist used for permanent film (resist for composing structural members) in the liquid crystal display devices (LCD) and so forth, and for the resist used for patterning the substrate of electronic materials, it is preferable to avoid as possible contamination of ionic impurities such as metal or organic substances, so as not to inhibit operations of the products. For this purpose, the concentration of ionic impurities such as metal or organic substances, in the curable composition for imprint of the present invention, is 1,000 ppm or below, preferably 10 ppm or below, and furthermore preferably 100 ppb or below.

Next, a method of forming a pattern (in particular, fine irregularity pattern) using the curable composition for imprints of the present invention will be explained. According to the pattern forming method of the present invention, the fine irregular pattern may be formed by implementing the steps of placing the curable composition for imprints of the present invention onto a substrate, to thereby form a pattern-forming layer; pressing a mold onto the surface of the pattern-forming layer; and irradiating light onto the pattern-forming layer, to thereby cure the composition of the present invention.

It is now preferable that the curable composition for imprints of the present invention is cured by further heating it after the photo-irradiation. More specifically, the pattern-forming layer composed of at least the composition of the present invention is placed on the substrate (base or support), and is dried as necessary so as to form a layer (pattern-forming layer) composed of the composition of the present invention, to thereby manufacture a pattern acceptor (the substrate having the pattern-forming layer provided thereon), the mold is pressed onto the surface of the pattern-forming layer of the pattern accepter, the mold pattern is transferred, and the layer for forming the fine irregularity pattern is cured by photo-irradiation. The photoimprinting lithography according to the pattern forming method of the present invention can afford stacking or multiple patterning, and also may be used in combination with the general thermal imprinting.

The paragraphs below will specifically describe a method of forming a pattern using the curable composition for imprint of the present invention (pattern transferring method).

In the method of forming a pattern of the present invention, first, the composition of the present invention is applied over the substrate to thereby form a pattern-forming layer.

A method of applying the curable composition for imprint of the present invention over the substrate is any of methods well known to the public, such as dip coating, air knife coating, curtain coating, wire bar coating, gravure coating, extrusion coating, spin coating, slit scanning, or ink jet process, by which a coated film or liquid droplets are applied to the substrate. Among them, the curable composition for imprint obtained by the method of manufacturing of the present invention is suitable for ink jet process.

The pattern-forming layer composed of the composition of the present invention has a thickness of 0.01 to 1 μm or around, although variable depending on purposes of use. The composition of the present invention may be applied by multi-coating. Furthermore, other organic layer such as a planarizing layer or the like may be formed between the substrate and the pattern-forming layer composed of the composition of the present invention. With this configuration, the pattern-forming layer is kept away from direct contact with the substrate, and thereby the substrate may be prevented from adsorbing dust or being damaged. Note that the pattern formed by the composition of the present invention keeps a good adherence with the organic layer, even if the organic layer is provided on the substrate.

The substrate (substrate or support) on which the curable composition for imprint of the present invention is applied is selectable, depending on various applications without special limitation, from quartz; glass; optical film; ceramic materials; evaporated film; magnetic film; reflective film; metal substrates composed of Ni, Cu, Cr, Fe and so forth; paper; SOG (Spin On Glass); polymer substrates such as polyester film, polycarbonate film and polyimide film; TFT array substrate; electrode panel of PDP; glass and translucent plastic substrates; electroconductive substrates composed of ITO, metals and so forth; insulating substrate; and semiconductor manufacturing substrate composed of silicon, silicon nitride, polysilicon, silicon oxide or amorphous silicon. Geometry of the substrate may be plate or roll, again without special limitation. As described later, the substrate is selectable from those with translucency and non-translucency, depending on combination with the mold.

Next, in the pattern forming method of the present invention, the mold is pressed onto the surface of the pattern-forming layer, in order to transfer the pattern to the pattern-forming layer. In this way, a fine pattern preliminarily formed on the surface to be pressed of the mold may be transferred to the pattern-forming layer.

Alternatively, the composition of the present invention may be coated on the mold having the pattern formed thereon, and the substrate may be pressed thereto.

The mold material usable in the invention is described. In the photoimprint lithography with the composition for imprints of the invention, a light-transmissive material is selected for at least one of the mold material and/or the substrate. In the photoimprint lithography applied to the invention, the curable composition for imprints of the invention is applied onto a substrate to form a patterning layer thereon, and a light-transmissive mold is pressed against the surface of the layer, then this is irradiated with light from the back of the mold and the patterning layer is thereby cured. Alternatively, the curable composition for photoimprints is applied onto a light-transmissive substrate, then a mold is pressed against it, and this is irradiated with light from the back of the substrate whereby the curable composition for photoimprints can be cured.

The photoirradiation may be attained while the mold is kept in contact with the layer or after the mold is released. In the invention, preferably, the photoirradiation is attained while the mold is kept in contact with the patterning layer.

The mold usable in the present invention is a mold having formed thereon a pattern to be transferred. The pattern on the mold may be formed for example by photolithography, electron beam lithography or the like, depending on a desired level of process accuracy. In the present invention, methods of forming the mold pattern are not specifically limited.

Not specifically defined, the light-transmissive mold material for use in the invention may be any one having a desired strength and durability. Concretely, its examples include glass, quartz, light-transparent resin such as PMMA or polycarbonate resin, transparent metal deposition film, flexible film of polydimethylsiloxane or the like, photocured film, metal film, etc.

The non-light-transmissive mold to be used in the invention where a light-transmissive substrate is used is not also specifically defined and may be any one having a predetermined strength. Concretely, examples of the mold material include ceramic material, deposition film, magnetic film, reflective film, metal material of Ni, Cu, Cr, Fe or the like, as well as SiC, silicon, silicon nitride, polysilicon, silicon oxide, amorphous silicon, etc. However, these are not limitative. The shape of the mold is not also specifically defined, and may be any of a tabular mold or a roll mold. The roll mold is used especially when continuous transfer in patterning is desired.

The mold for use in the patterning method of the invention may be processed for surface release treatment for the purpose of enhancing the releasability of the curable composition for imprints from the mold. The mold of the type includes those surface-treated with a silicone-type or fluorine-containing silane coupling agent, for which, for example, commercial release agents such as Daikin's Optool DSX, Sumitomo 3M's Novec EGC-1720 and others are preferred.

In photoimprint lithography with the curable composition for imprints, in general, the mold pressure in the patterning method of the invention is preferably at most atmospheres. When the mold pressure is at most 10 atmospheres, then the mold and the substrate are hardly deformed and the patterning accuracy tends to increase. It is also favorable since the pressure unit may be small-sized since the pressure to be given to the mold may be low. The mold pressure is preferably selected from the region capable of securing the mold transfer uniformity, within a range within which the residual film of the curable composition for imprints in the area of mold pattern projections may be reduced.

In the patterning method of the invention, the dose of photoirradiation in the step of irradiating the patterning layer with light may be sufficiently larger than the dose necessary for curing. The dose necessary for curing may be suitably determined depending on the degree of consumption of the unsaturated bonds in the curable composition for imprints and on the tackiness of the cured film as previously determined.

In the imprint lithography applied to the present invention, photo-irradiation is conducted while keeping the substrate temperature generally at room temperature, wherein the photo-irradiation may alternatively be conducted under heating for the purpose of enhancing the reactivity. Also photo-irradiation in vacuo is preferable, since a vacuum conditioning prior to the photo-irradiation is effective for preventing entrainment of bubbles, suppressing the reactivity from being reduced due to incorporation of oxygen, and for improving the adhesiveness between the mold and the curable composition for imprints. In the method of forming a pattern according to the present invention, the degree of vacuum in the process of photo-irradiation is preferably in the range from $10^{-1}$ Pa to normal pressure.

Light to be used for photoirradiation to cure the curable composition for imprints of the invention is not specifically defined. For example, it includes light and irradiations with a wavelength falling within a range of high-energy ionizing radiation, near-ultraviolet, far-ultraviolet, visible, infrared, etc. The high-energy ionizing radiation source includes, for example, accelerators such as Cockcroft accelerator, Handegraf accelerator, linear accelerator, betatoron, cyclotron, etc. The electron beams accelerated by such an accelerator are used most conveniently and most economically; but also are any other radioisotopes and other radiations from nuclear reactors, such as γ rays, X rays, α rays, neutron beams, proton beams, etc. The UV sources include, for example, UV fluorescent lamp, low-pressure mercury lamp, high-pressure mercury lamp, ultra-high-pressure mercury lamp, xenon lamp, carbon arc lamp, solar lamp, LED, etc. The radiations include microwaves, EUV, etc. In addition, laser rays for use in microprocessing of semiconductors, such as LED, semiconductor laser ray, 248 nm KrF excimer laser ray, 193 nm ArF excimer laser ray and others, are also favorably used in the invention. These lights may be monochromatic lights, or may also be lights of different wavelengths (mixed lights).

In photoexposure, the light intensity is preferably within a range of from 1 mW/cm$^2$ to 50 mW/cm$^2$. When the light intensity is at least 1 mW/cm$^2$, then the producibility may increase since the photoexposure time may be reduced; and when the light intensity is at most 50 mW/cm$^2$, then it is favorable since the properties of the permanent film formed may be prevented from being degraded owing to side reaction. Also preferably, the dose in photoexposure is within a range of from 5 mJ/cm$^2$ to 1000 mJ/cm$^2$. When the dose is less than 5 mJ/cm$^2$, then the photoexposure margin may be narrow and there may occur problems in that the photocuring may be insufficient and the unreacted matter may adhere to mold. On the other hand, when the dose is more than 1000 mJ/cm$^2$, then the composition may decompose and the permanent film formed may be degraded.

Further, in photoexposure, the oxygen concentration in the atmosphere may be controlled to be less than 100 mg/L by introducing an inert gas such as nitrogen or argon into the system for preventing the radical polymerization from being retarded by oxygen.

In the patterning method of the invention, after the pattern layer (a layer comprising the curable composition for imprints layer) is cured through photoirradiation, if desired, the cured pattern may be further cured under heat given thereto. The method may additionally includes the post-curing step. Thermal curing of the composition of the invention after photoirradiation is preferably attained at 150 to 280° C., more preferably at 200 to 250° C. The heating time is preferably from 5 to 60 minutes, more preferably from 15 to 45 minutes.

[Pattern]

The pattern thus formed by the method of forming a pattern according to the present invention is usable as a permanent film (resist for composing structural members) directed to use in liquid crystal display (LCD) devices, or as an etching resist. The permanent film, after manufactured, is transported or stored while being bottled in containers such as gallon bottles or coated bottles. The inside of the containers may be replaced with inert nitrogen or argon, for the purpose of preventing degradation. While the permanent film may be transported or stored at normal temperature, the temperature may alternatively be controlled in the range from −20° C. to 0° C., in order to prevent the permanent film from being denatured. Of course, the permanent film is preferably shielded from light to a degree enough to suppress the reaction.

The pattern formed by using the curable composition for imprint of the present invention is also excellent in solvent resistance. While the curable composition for imprint of the present invention is preferably durable against a wide variety of solvents, it is particularly preferable that the pattern will not change in thickness even after immersed for 10 minutes in a solvent generally used for manufacturing substrate, such as N-methylpyrrolidone at 25° C.

The pattern of the present invention will have a smooth surface, with the mean-squared surface roughness (RMS) typically reduced to less than 0.5 nm. The RMS is measurable by observing the surface of the cured film under an atomic force microscope (AFM).

The pattern formed by the method of forming a pattern of the present invention is also usable as an etching resist. When the curable composition for imprint of the present invention is used as an etching resist, first, for example a silicon wafer having formed thereon a thin film of $SiO_2$ or the like is used as the substrate, and then on the substrate, a nanometer-order fine pattern is formed by the method of forming a pattern according to the present invention. Etching is then conducted using hydrofluoric acid for wet etching, or an etching gas such as $CF_4$ for dry etching, to thereby form a desired pattern on the substrate. The curable composition for imprint of the present invention preferably demonstrate a good etching resistance in the dry etching using fluorocarbon or the like.

EXAMPLE

The characteristics of the invention are described more concretely with reference to Production Examples and Examples given below. In the following Examples, the material used, its amount and the ratio, the details of the treatment and the treatment process may be suitably modified or changed not overstepping the scope of the invention. Accordingly, the invention should not be limitatively interpreted by the Examples mentioned below.

Materials described below were used in this embodiment.
(A1) Polymerizable Monomer: Synthesis of m-Xylylene Diacrylate To 1,000 ml of distilled water, 411 g of sodium hydroxide was added, and therein 781 g of acrylic acid was dropped under cooling on ice. The mixture was further added with 107 g of benzyltributylammonium chloride and 600 g of α,α'-dichloro-meta-xylene, and allowed to react at 85° C. for 7 hours. The reaction liquid was added with 1,600 ml of ethyl acetate, the organic layer was successively washed with a 1% aqueous hydrochloric acid solution, a 1% aqueous tetramethylammonium hydroxide solution, and distilled water, the organic layer was added with 0.01 g of p-benzoquinone as a polymerization inhibitor, and the organic layer was concentrated in vacuo until the solvent content is reduced down to 1% by mass or below, to thereby obtain a polymerizable monomer (A1).

(A2) Synthesis of Polymerizable Monomer: Synthesis of 2-Naphthylmethyl Acrylate

Under nitrogen gas flow, 600 g of 2-methylnaphthalene was dissolved into 6,000 ml of ethyl acetate, the mixture was then added with 422 g of 1,3-dibromo-5,5-dimethylhydantoin, and heated to 40° C. The mixture was added with 7.4 g of V-65 from Wako Pure Chemical Industries, Ltd., and allowed to react at 40° C. for 7 hours. Thereafter, the reaction liquid was allowed to react at 65° C. for 3 hours, and then cooled. The reaction liquid was successively washed with aqueous sodium hydrogen carbonate solution and distilled water, and then concentrated. The concentrate was added with 3,600 ml of isopropanol, stirred for 30 minutes, added with 900 ml of distilled water, and further stirred for 30 minutes. Precipitated solid was collected by filtration, added with 1,800 ml of isopropanol, the mixture was stirred for 30 minutes, added with 450 ml of distilled water, and further stirred for 30 minutes. The resultant solid was collected by filtration, and dried, to thereby obtain 300 g of 2-bromomethylnaphthalene.

To 200 ml of distilled water, 81.4 g of sodium hydroxide was added, and therein 147 g of acrylic acid was dropped under cooling on ice. The mixture was added with 42.4 g of benzyltributylammonium chloride and 300 g of 2-bromomethylnaphtnalene, and then allowed to react at 75° C. for 2 hours. The reaction liquid was added with 800 ml of ethyl acetate/hexane=2/8 (ratio by volume), the organic layer was successively washed with a 1% aqueous hydrochloric acid solution, a 1% aqueous tetramethylammonium hydroxide solution and distilled water, the organic layer was added with 0.01 g of p-benzoquinone as a polymerization inhibitor, the organic layer was concentrated in vacuo until the solvent content is reduced down to 1% by mass or below, to thereby obtain a polymerizable monomer (A2).

A3: Isoboronyl Acrylate (IBXA, from Osaka Organic Chemical Industry, Ltd.)

A'1: Perfluorohexylethylacrylate (from Kanto Chemical Co., Inc.)

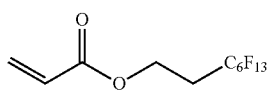

A'2: Synthesized According to a Method Described in JP-a-2010-239121

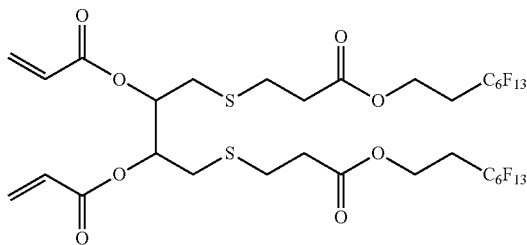

(B1) Photo-Polymerization Initiator: Irgacure 379EG (from BASF)

(C1) Components

Components listed in Table below were used. Structures are shown below.

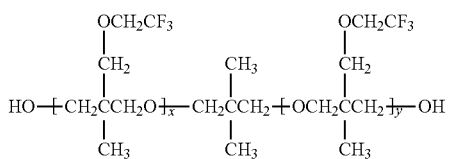
PF636 (from Omnova Solutions Inc.)

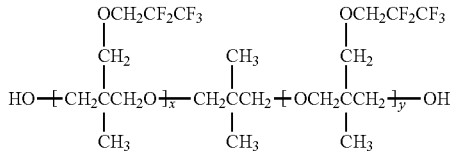
PF6520 (from Omnova Solutions Inc.)

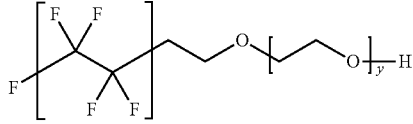
Zonyl FSO-100 (from DuPont)

(C2) Components

Components obtained by polymerizing the repeating units shown below according to the ratio listed in Table below were used. The compositional ratio listed in Table below is given in the form of (content of right repeating unit)/(content of left repeating unit) of each set of repeating units shown below.

TABLE 2

|  | Compositional ratio [%] | Contained element(s) | F/Si contents | Mw |
|---|---|---|---|---|
| C4 | 35/65 | F | 13% | 10000 |
| C5 | 35/65 | Si | 5% | 6500 |
| C6 | 25/75 | F/Si | 7%/10% | 3000 |
| C7 | 40/60 | F | 19% | 95000 |
| C8 | 100 | Si | 35% | 15000 |
| C9 | 15/85 | F/Si | 3%/8% | 1300 |
| C10 | 35/65 | F | 10% | 42000 |
| C11 | 85/15 | Si | 11% | 2600 |
| C12 | 12/33/55 | F/Si | 5%/3% | 16000 |
| C13 | 5/95 | F | 2% | 7800 |
| C14 | 30/70 | Si | 4% | 12000 |
| C15 | 2/38/60 | F/Si | 1%/3% | 6700 |
| C16 | 100 | — | 0% | 3700 |
| C17 | 33/67 | F | 15% | 890 |

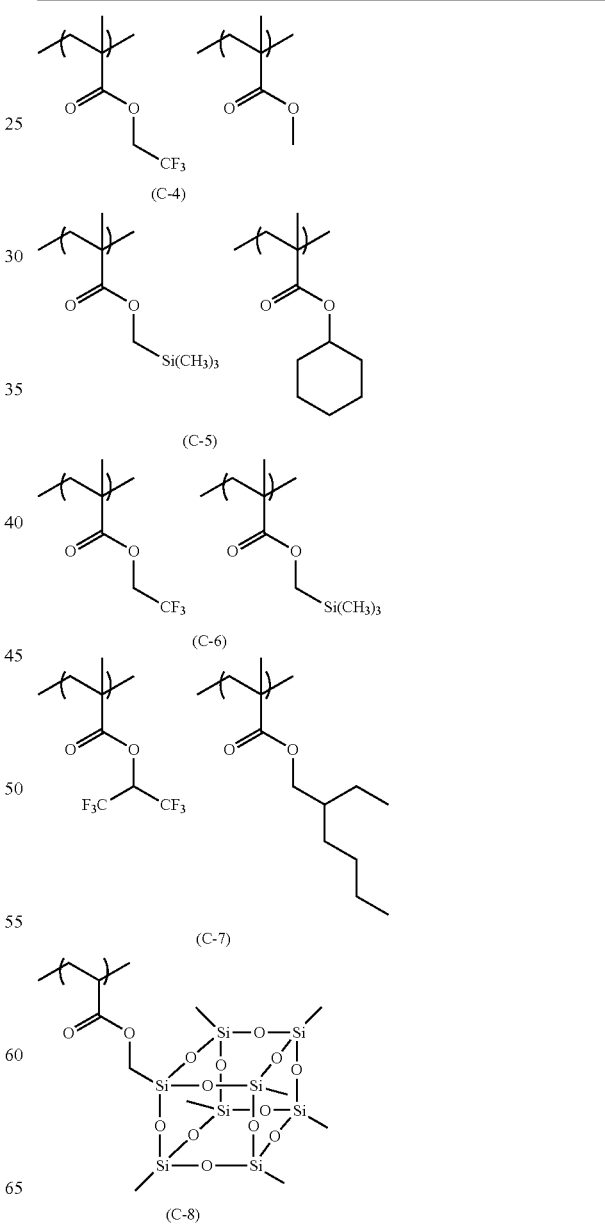

TABLE 2-continued
| Compositional ratio [%] | Contained element(s) | F/Si contents | Mw |
|---|---|---|---|
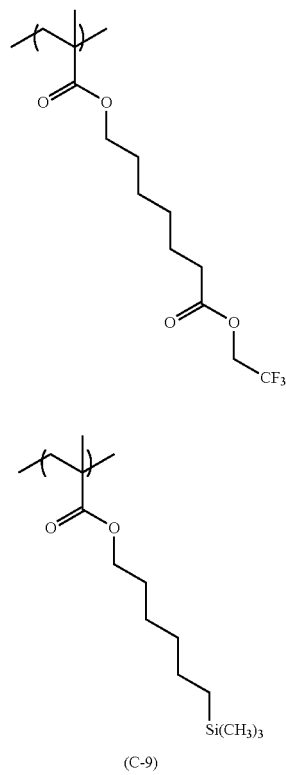
(C-9)
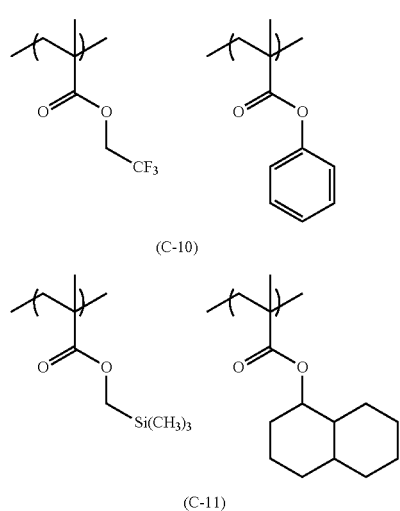
(C-10)
(C-11)
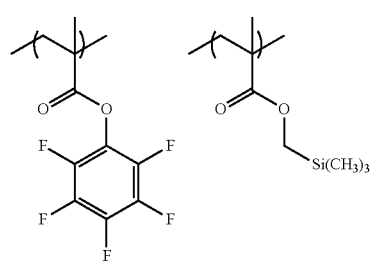
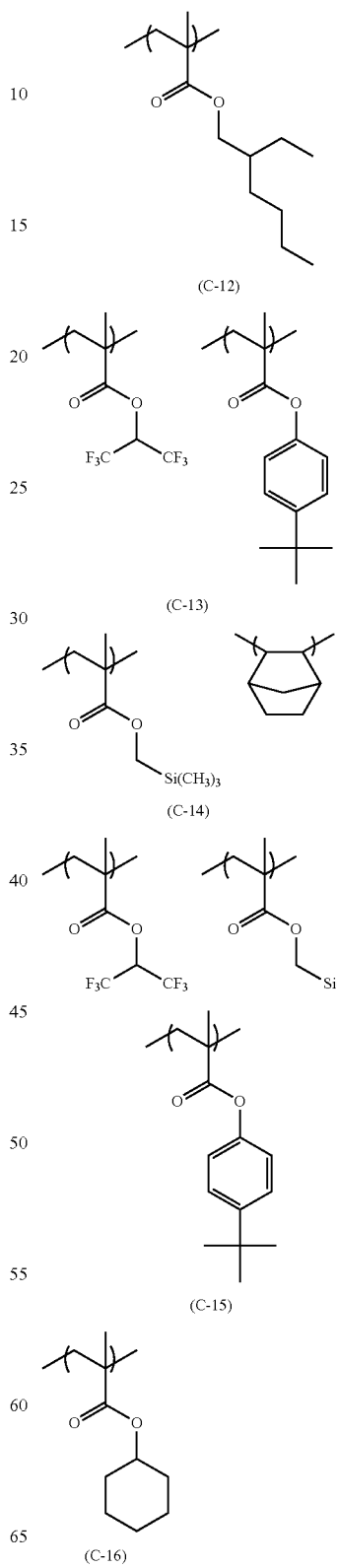
(C-12)
(C-13)
(C-14)
(C-15)
(C-16)

TABLE 2-continued

| Compositional ratio [%] | Contained element(s) | F/Si contents | Mw |
|---|---|---|---|

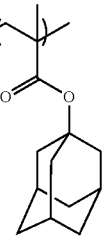

(C-17)

Preparation of Curable Composition for Imprint

The curable composition for imprint was prepared by mixing the individual components according to the compositional ratio shown in Table below. Filters named Optimizer D300, with pore sizes of 0.1 μm and 0.02 μm (ultra-high molecular weight polyethylene filter, from Nihon Entegris K.K.) were connected in series, through which the obtained solution was allowed to pass twice. Pressure applied in this process was controlled so as to adjust the flow rate to 0.05 L/min.

Measurement of Surface Roughness of Cured Film in Mold Releasing

A quartz mold having no pattern on the surface thereof was used as a mold.

Using an ink jet printer DMP-2831 from FUJIFILM Dimatix, Inc. as an ink jet device, the curable composition was ejected onto a silicon wafer with a droplet volume per nozzle of 1 pl, while controlling time of ejection so as to array the droplets in a square matrix with a pitch of 100 μm. In this process, temperature of the curable composition to be ejected was adjusted to 25° C. The curable composition was successively ejected over the entire surface of the 4-inch wafer, the mold was placed thereon under a He atmosphere, exposed through the mold with a mercury lamp under a condition of 300 mJ/cm$^2$, separated from the mold, to thereby obtain a cured film. A 5 μm×5 μm area of the thus obtained cured film was observed under an atomic force microscope NanoScope 4 from Veeco Instruments, Inc., and mean-squared surface roughness RMS was evaluated.

By the technique same as the above, ten slices of wafer were repetitively cured under the same mold, and the cured film formed on the tenth wafer was evaluated for the roughness in the same way as described above. Results of evaluation of the first and tenth curing are shown in Table below.

TABLE 3

| | Polymerizable compound (A) | Amount of addition (% by mass) | Fluorine-containing polymerizable compound (A') | Amount of addition (% by mass) | Polymerization initiator (B) | Amount of addition (% by mass) | Surfactant (C1) |
|---|---|---|---|---|---|---|---|
| Example1 | A1 | 95 | None | — | B1 | 2 | PF636 |
| Example2 | A1 | 94 | A' 1 | 1 | B1 | 2 | PF636 |
| Example3 | A1 | 93 | None | — | B1 | 2 | PF636 |
| Example4 | A1 | 93 | None | — | B1 | 2 | PF636 |
| Example5 | A1 | 92 | A' 1 | 1 | B1 | 2 | PF6520 |
| Example6 | A1 | 92 | A' 1 | 1 | B1 | 3 | PF6520 |
| Example7 | A1 | 92 | A' 1 | 1 | B1 | 3 | PF6520 |
| Example8 | A1 | 92 | None | — | B1 | 4 | Zonyl FSO-100 |
| Example9 | A1 | 93 | None | — | B1 | 4 | Zonyl FSO-100 |
| Example10 | A1 | 93 | None | — | B2 | 3 | Zonyl FSO-100 |
| Example11 | A1/A2 | 93 | None | — | B1 | 3 | PF636 |
| Example12 | A1/A2 | 87 | A' 2 | 2 | B1 | 3 | PF6520 |
| Example13 | A1/A2 | 94 | None | — | B1 | 2 | Zonyl FSO-100 |
| Example14 | A3 | 93 | None | — | B1 | 2 | PF636 |
| Example15 | A3 | 93 | None | — | B1 | 2 | PF6520 |
| Example16 | A3 | 92 | None | — | B1 | 3 | Zonyl FSO-100 |
| Comparative Example1 | A1 | 95 | None | — | B1 | 2 | PF636 |
| Comparative Example2 | A1 | 95 | None | — | B1 | 2 | — |
| Comparative Example3 | A1 | 95 | None | — | B1 | 2 | PF636 |
| Comparative Example4 | A1/A2 | 95 | None | — | B1 | 3 | — |
| Comparative Example5 | A1 | 95 | None | — | B1 | 2 | — |
| Comparative Example6 | A1 | 95 | None | — | B1 | 2 | PF636/PF6520 |

| | Amount of addition (% by mass) | Polymer (C2) | Amount of addition (% by mass) | Additives other than (C1) and (C2) | Amount of addition (% by mass) | Surface RMS of cured film [nm] (First/tenth forming) |
|---|---|---|---|---|---|---|
| Example1 | 1 | C-4 | 2 | — | — | 0.13/0.11 |
| Example2 | 1 | C-4 | 2 | — | — | 0.22/0.20 |
| Example3 | 2 | C-5 | 3 | — | — | 0.27/0.34 |
| Example4 | 4 | C-6 | 1 | — | — | 0.14/0.19 |
| Example5 | 3 | C-7 | 2 | — | — | 0.21/0.23 |
| Example6 | 1 | C-8 | 3 | — | — | 0.29/0.36 |
| Example7 | 2 | C-9 | 2 | — | — | 0.20/0.19 |
| Example8 | 2 | C-10 | 2 | — | — | 0.15/0.15 |
| Example9 | 2 | C-11 | 1 | — | — | 0.26/0.33 |
| Example10 | 1 | C-12 | 3 | — | — | 0.23/0.22 |
| Example11 | 2 | C-5/C-6 | 1/1 | — | — | 0.24/0.23 |
| Example12 | 4 | C-6 | 2 | C13 | 2 | 0.24/0.24 |
| Example13 | 2 | C-4 | 2 | — | — | 0.11/0.16 |

TABLE 3-continued

|  |  |  |  |  |  |  |
|---|---|---|---|---|---|---|
| Example14 | 1 | C-6 | 4 | — | — | 0.16/0.20 |
| Example15 | 3 | C-4 | 1 | C14 | 1 | 0.13/0.22 |
| Example16 | 1 | C-5 | 3 | C15 | 1 | 0.39/0.42 |
| Comparative Example1 | 3 | — | — | — | — | 0.51/0.66 |
| Comparative Example2 | — | C-4 | 2 | C16 | 1 | 1.51/1.46 |
| Comparative Example3 | 1 | — | — | C17 | 2 | 0.92/1.12 |
| Comparative Example4 | — | C-6 | 2 | — | — | 1.43/1.64 |
| Comparative Example5 | — | C-4/C-6 | 2/1 | — | — | 0.85/0.93 |
| Comparative Example6 | 1/2 | — | — | — | — | 0.52/0.55 |

The fluorine content of the (C1) component used in Examples above are as follows.

TABLE 4

|  | Fluorine content |
|---|---|
| PF636 | 28% |
| PF6520 | 40% |
| Zonyl FSO-100 | 69% |

In Table above, the fluorine atom content was calculated from the results of elementary analysis of the compound.

$$\text{Fluorine content} = \frac{\text{(Number of fluorine atoms in compound)} \times \text{(Atomic weight of fluorine atom)}}{\text{Molecular weight of compound}} \times 100$$

Also the silicon atom content was calculated in the same way.

As is clear from Table 1, the curable compositions for imprint of the present invention were found to be excellent in surface roughness of the cured film in the mold releasing, whereas the compositions for imprint of Comparative Examples were found to be inferior in the surface roughness.

The present disclosure relates to the subject matter contained in Japanese Patent Application No. 210530/2011 filed on Sep. 27, 2011, which is expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

The invention claimed is:

1. A curable composition for imprint comprising a polymerizable compound (A), a polymerization initiator (B), and a non-polymerizable compound (C),
    the non-polymerizable compound (C) comprising at least one species of surfactant (C1) which contains 20% by mass or more of fluorine atom, and, at least one species of polymer (C2) which contains 3% by mass or more and less than 20% by mass of fluorine atom and/or 5% by mass or more and less than 40% by mass of silicon atom, and has a weight-average molecular weight of 1,000 to 100,000.

2. The curable composition for imprint of claim 1, wherein the polymer (C2) contains, at least, 3% by mass or more and less than 20% by mass of fluorine atom.

3. The curable composition for imprint of claim 1,
    wherein difference between the fluorine atom content of the compound (C1) and the total content of fluorine atom and silicon atom of the polymer (C2) is 3 to 70% by mass.

4. The curable composition for imprint of claim 1,
    wherein the compound (C1) is a compound having a fluorine atom-containing alkyl group, a fluorine atom-containing cycloalkyl group, or a fluorine atom-containing aryl group.

5. The curable composition for imprint of claim 1,
    wherein the polymer (C2) is a compound having a fluorine atom-containing alkyl group, a fluorine atom-containing cycloalkyl group, or a fluorine atom-containing aryl group.

6. The curable composition for imprint of claim 1,
    wherein the polymerizable compound (A) is a (meth)acrylate compound.

7. The curable composition for imprint of claim 1,
    wherein the polymerizable compound (A) is a compound having an aromatic group and/or an alicyclic hydrocarbon group.

8. The curable composition for imprint of claim 1,
    wherein the compound (C1) has a fluorine atom-containing alkyl group, a fluorine atom-containing cycloalkyl group, or a fluorine atom-containing aryl group, and, the polymer (C2) has a fluorine atom-containing alkyl group, a fluorine atom-containing cycloalkyl group, or a fluorine atom-containing aryl group.

9. The curable composition for imprint of claim 1,
    wherein difference between the fluorine atom content of the compound (C1), and the total content of fluorine atom and silicon atom of the polymer (C2) is 3 to 70% by mass, and the polymer (C2) contains, at least, 3% by mass or more and less than 20% by mass of fluorine atom.

10. The curable composition for imprint of claim 1,
    wherein difference between the fluorine atom content of the compound (C1), and, the total content of fluorine atom and silicon atom of the polymer (C2) is 3 to 70% by mass, and the polymer (C2) is a compound having a fluorine atom-containing alkyl group, a fluorine atom-containing cycloalkyl group, or a fluorine atom-containing aryl group.

11. The curable composition for imprint of claim 1,
    wherein the compound (C1) is a compound having a fluorine atom-containing alkyl group, a fluorine atom-containing cycloalkyl group, or a fluorine atom-containing aryl group, and the polymer (C2) contains, at least, 3% by mass or more and less than 20% by mass of fluorine atom.

12. The curable composition for imprint of claim 1, wherein the polymerizable compound (A) is a (meth)acrylate compound, difference between the fluorine atom content of the compound (C1), and the total content of fluorine atom and silicon atom of the polymer (C2) is 3 to 70% by mass, and the polymer (C2) contains, at least, 3% by mass or more and less than 20% by mass of fluorine atom.

13. The curable composition for imprint of claim 1, wherein the polymerizable compound (A) is a (meth)acrylate compound, the compound (C1) is a compound having a fluorine atom-containing alkyl group, a fluorine atom-containing cycloalkyl group, or a fluorine atom-containing aryl group, and, the polymer (C2) is a compound having a fluorine atom-containing alkyl group, a fluorine atom-containing cycloalkyl group, or a fluorine atom-containing aryl group.

14. The curable composition for imprint of claim 1, wherein the polymerizable compound (A) is a compound having an aromatic group and/or an alicyclic hydrocarbon group, the compound (C1) is a compound having a fluorine atom-containing alkyl group, a fluorine atom-containing cycloalkyl group, or a fluorine atom-containing aryl group, and the polymer (C2) is a compound having a fluorine atom-containing alkyl group, a fluorine atom-containing cycloalkyl group, or a fluorine atom-containing aryl group.

15. A method of forming a pattern, the method comprising: applying the curable composition for imprint described in claim 1 on a substrate or on a mold having a fine pattern formed thereon, and subjecting the curable composition for imprint to light exposure, while being held between the mold and the substrate.

16. The method of forming a pattern of claim 15, wherein the curable composition for imprint is applied on the substrate by ink jet process.

17. A pattern formed by the method described in claim 15.

18. The pattern of claim 17, wherein, when viewed in the thickness-wise direction of the pattern, the fluorine atom content in the 10% range from the substrate surface, the fluorine atom content in the 45 to 55% range from the substrate surface, and the fluorine atom content in the 90 to 100% range from the substrate surface, increase in this order.

19. An electronic device comprising the pattern described in claim 17.

20. A method of manufacturing an electronic device comprising the method of forming a pattern described in claim 15.

* * * * *